United States Patent
Kikuchi et al.

(10) Patent No.: US 6,515,237 B2
(45) Date of Patent: Feb. 4, 2003

(54) THROUGH-HOLE WIRING BOARD

(75) Inventors: Junichi Kikuchi, Hitachi (JP); Kuniaki Sato, Hitachi (JP); Hideji Kuwajima, Hitachinaka (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 0 days.

(21) Appl. No.: 09/989,060

(22) Filed: Nov. 21, 2001

(65) Prior Publication Data

US 2002/0062990 A1 May 30, 2002

(30) Foreign Application Priority Data

| Nov. 24, 2000 | (JP) | ...................................... | 2000-356887 |
| Jan. 25, 2001 | (JP) | ...................................... | 2001-016525 |
| Jan. 30, 2001 | (JP) | ...................................... | 2001-020911 |
| Feb. 14, 2001 | (JP) | ...................................... | 2001-036257 |
| Feb. 20, 2001 | (JP) | ...................................... | 2001-042718 |
| Feb. 28, 2001 | (JP) | ...................................... | 2001-053439 |

(51) Int. Cl.$^7$ ................................................ H01R 9/09
(52) U.S. Cl. ...................... 174/261; 174/255; 174/202; 29/852
(58) Field of Search ................................. 174/262, 255, 174/257, 261, 264; 29/852; 427/97; 361/767, 772

(56) References Cited

U.S. PATENT DOCUMENTS

| 5,444,189 | A | * | 8/1995 | Nakaso et al. ............... 174/262 |
| 5,981,043 | A | * | 11/1999 | Murakami et al. ........... 174/261 |
| 6,000,129 | A | * | 12/1999 | Bhatt et al. .................... 29/852 |
| 6,326,561 | B1 | * | 12/2001 | Watanabe et al. ............ 174/264 |

* cited by examiner

Primary Examiner—Albert W. Paladini
(74) Attorney, Agent, or Firm—Antonelli, Terry, Stout & Kraus, LLP

(57) ABSTRACT

A through-hole wiring board comprising through-holes passing through a substrate and filled with an electroconductive material; copper toil lands and copper foil circuits formed on surfaces of the substrate; insulating layers formed on the copper toil circuits and between necessary portions of the copper foil lands and the copper foil circuits; and printed circuits (jumper circuits) formed by another electroconductive material having a different composition from that filling the through-holes on a part of the copper foil circuits, and the copper foil lands and the insulating layers except for unnecessary portions for electroconductivity; wherein the printed circuits and ends of the through-holes are electrically connected with an electroconductive material having a different composition from that filling the through-holes, permits easy formation of an electrical connection of the through-holes, has a high reliability on connection and is suitable for industrial production.

44 Claims, 6 Drawing Sheets

THROUGH-HOLE WIRING BOARD

BACKGROUND OF THE INVENTION

This invention relates to a through-hole wiring board.

As a process for forming an electroconductive circuit on a printed wiring board, there is a process in which as described in "Denshi Zairyo" for October, pp. 42–46 (1994), an electroconductive circuit is formed by using a paste obtained by mixing electroconductive powder such as gold, silver, copper, carbon optionally additives. In fields where a high electroconductivity is required, gold powder or silver powder has been generally used.

An electroconductive paste containing silver powder is used for forming the wiring layers (the electroconductive layers) of printed wiring boards, electronic parts and the like, or the electric circuits and electrodes of electronic parts because of its good electroconductivity. Such a paste, however, is disadvantageous in that when an electric field is applied thereto in a high-temperature and high-humid atmosphere, silver electrodeposition called migration occurs on the electric circuits or the electrodes, so that a short circuit is produced between the electrodes or wirings. Several measures for preventing the migration have been adopted. Measures such as the application of a moisture-proof coating material on the surface of a conductor or the addition of a corrosion inhibitor (e.g. a nitrogen-containing compound) to the electroconductive paste have been investigated but have been not sufficiently effective.

SUMMARY OF THE INVENTION

The present invention is intended to provide a through-hole wiring board which is free from the defects of the above-mentioned prior art, permits easy formation of an electrical connection of through-holes, has a high reliability on connection, and has a small thickness of an electroconductive material formed on copper foil lands.

The present invention provides a through-hole wiring board comprising through-holes passing through a substrate and filled with an electroconductive material; copper foil lands and copper foil circuits formed on surfaces of the substrate; insulating layers formed on the copper foil circuits and between necessary portions of the copper foil lands and the copper foil circuits; and printed circuits (jumper circuits) formed by another electroconductive material having a different composition from that filling the through-holes on a part of the copper foil circuits, and the copper foil lands and the insulating layers except for unnecessary portions for electroconductivity; wherein the printed circuits and ends of the through-holes are electrically connected with an electroconductive material having a different composition from that filling the through-holes.

DETAILED DESCRIPTION OF THE INVENTION

Figure 1:
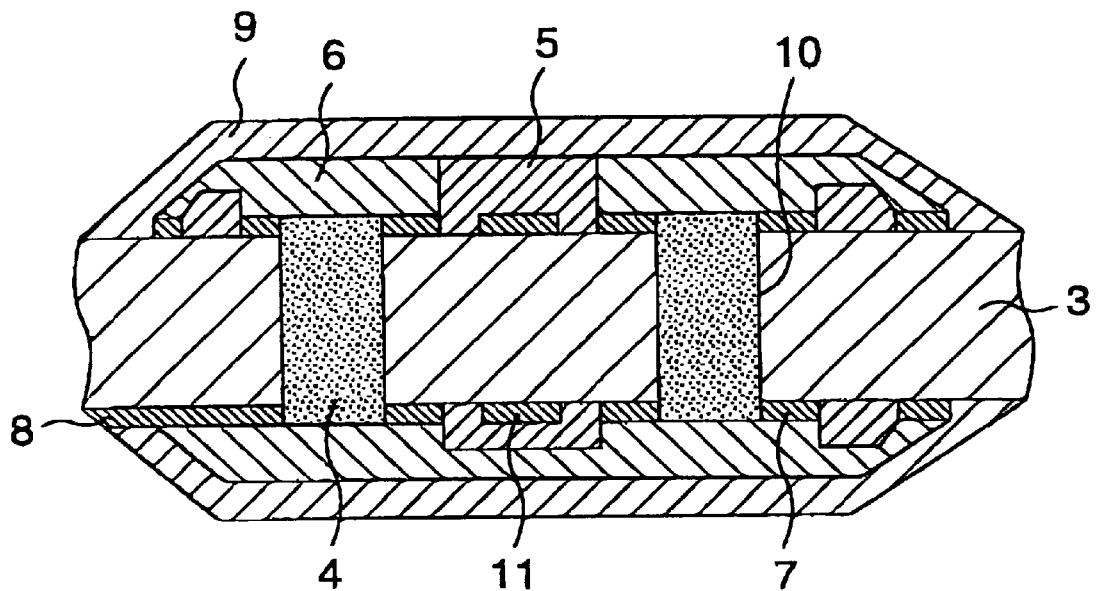
FIG. 1 is a cross-sectional view of a through-hole wiring board according to an example of the present invention.

The through-hole wiring board of the present invention comprises through-holes passing through a substrate and filled with an electroconductive material; copper foil lands and copper foil circuits formed on surfaces of the substrate; insulating layers formed on the copper foil circuits and between necessary portions of the copper foil lands and the copper foil circuits; and printed circuits (jumper circuits) formed by another electroconductive material having a different composition from that filling the through-holes on a part of the copper foil circuits, and the copper foil lands and the insulating layers except for unnecessary portions for electroconductivity; wherein the printed circuits and ends of the through-holes are electrically connected with an electroconductive material having a different composition from that filling the through-holes.

In an electroconductive paste containing silver powder, the silver powder content should be increased in order to obtain a conductor having a good electric resistance. Such an electroconductive paste is disadvantageous in that it is expensive because the silver powder is expensive. When silver-coated copper powder is used, the migration can be improved and an inexpensive electroconductive paste can be obtained. However, when the silver coating is uniform and thick, the migration cannot be improved. Moreover, the silver-coated copper powder is disadvantageous in that soldering cannot be conducted directly on a coating film of the electroconductive paste obtained. The electroconductive paste using silver powder is disadvantageous also in that when it is subjected to soldering, loss of silver during soldering is caused, so that no sufficient joining can be conducted.

On the other hand, in an electroconductive paste using copper powder, the oxidizability of copper after curing by heating is high. Therefore, oxygen contained in the air and a binder reacts with the copper powder to form an oxide film on the surface of the copper powder, resulting in a very low electroconductivity. Accordingly, there have been disclosed copper pastes which have a stable electroconductivity owing to the addition of various additives for preventing the oxidation of copper powder. The copper pastes are inferior in electroconductivity to the silver pastes and are poor in storage stability. Moreover, the conventional copper pastes are disadvantageous in that soldering cannot be conducted directly on a coating film of the copper paste.

Since a well-known electroconductive paste cannot be directly subjected to soldering as described above, soldering has been conducted on a copper surface formed by subjecting a coating film of the electroconductive paste to an activation treatment and then electroless plating, or by carrying out copper electroplating in a plating solution by using a coating film of the electroconductive paste as a cathode.

This method, however, is not practical if the interlaminar bonding between the coating film and the plated copper film is not reliable. Therefore, a circuit formation process can be greatly shortened by developing an electroconductive paste which can be subjected to soldering without the electroless plating or electroplating. Thus, the merit of the development is great.

Solder is easily joined to some metals but cannot be joined to a binder. In conducting soldering, ideally, a coating film composed of only electroconductive powder is formed and soldering is conducted on the coating film. However, when the electroconductive powder is used alone, the reliability and the work-efficiency in the formation of the coating film are not sufficient.

Therefore, the electroconductive powder is used after being made into an electroconductive paste by use of a binder. However, when the proportion of the binder is increased because importance is attached to the reliability and the work-efficiency in the formation of the coating film, the binder covers the electroconductive powder of a metal, so that there is no area where solder comes into contact with the electroconductive powder. Therefore, the solder does not adhere to the electroconductive powder, resulting in a low electroconductivity.

In order to obtain an electroconductive paste to which solder adheres, the composition of the paste should be made as close as possible to that of copper foil. That is, the composition should be such that when the electroconductive paste is placed in a certain space, the filling properties of the electroconductive powder are so high that the binder occupies only the total volume of the spaces formed among particles of the electroconductive powder.

However, when the proportion of the electroconductive powder is increased as described above, the viscosity of the electroconductive paste is extremely increased, so that the production of the electroconductive paste becomes difficult and that the work-efficiency in applying the electroconductive paste is deteriorated. Moreover, since the proportion of the binder capable of bonding particles of the electroconductive powder to one another is low, the strength of a coating film is decreased. Therefore, when joining is conducted by soldering by use of the electroconductive paste, the electroconductive paste should have a good balance among solderability, electroconductivity, work-efficiency and strength.

Figure 2:
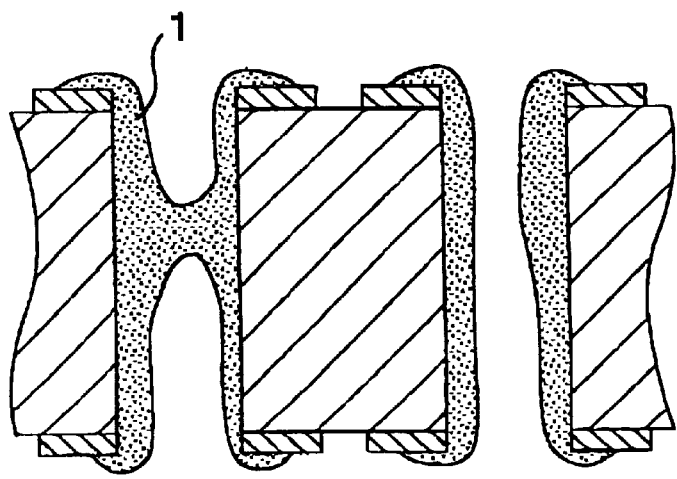
FIG. 2 is a cross-sectional view showing a state in which through-holes are connected by use of an electroconductive paste.

A method for using the electroconductive paste comprises forming the electroconductive layer shown in FIG. 2, by either applying the electroconductive paste obtained by dispersing the electroconductive powder in the binder, on the surface of a substrate, or filling the through-holes with the electroconductive paste. In FIG. 2, numeral 1 denotes the electroconductive paste.

Figure 3:
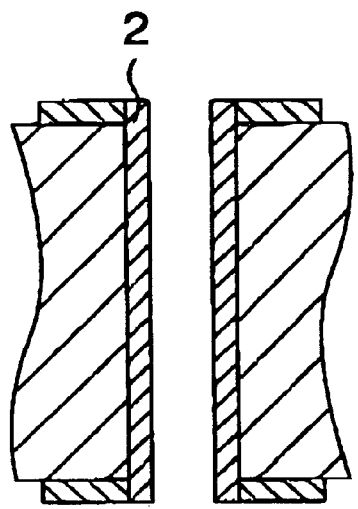
FIG. 3 is a cross-sectional view showing a state in which through-holes are connected by copper plating.

As another method for forming an electroconductive layer in each of through-holes formed in a printed wiring board, there is a method in which the electroconductive layer is formed by forming a plated copper film 2 on each inner surface of the through-holes as shown in FIG. 3.

Figure 4:
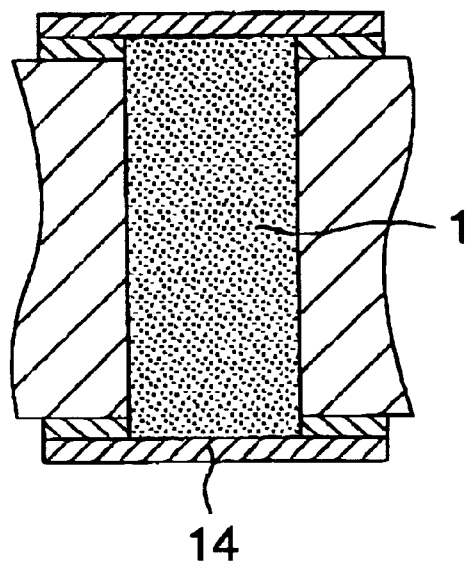
FIG. 4 is a cross-sectional view showing a state in which an electroconductive paste fills the through-holes for interlaminar connection of a multilayer printed writing board.

In general, in the case of an interlaminar connection formed by using a filling electroconductive paste in order to fill through-holes, a high electroconductivity is required though the through-holes are small. Therefore, the electroconductive paste should be filled into the holes as much as possible so that the holes may be filled therewith closely, for example, as shown in FIG. 4. Accordingly, a conventional electroconductive paste should be increased in the proportion of electroconductive powder. However, when the proportion of the electroconductive powder is increased, the viscosity of the electroconductive paste is increased, so that the filling properties into the holes are deteriorated. On the other hand, when the proportion of a binder is increased for reducing the viscosity to improve the filling properties into the holes, the electroconductivity is undesirably deteriorated. In FIG. 4, numeral 14 denotes copper foil.

As a measure for solving this problem, a solventless electroconductive paste containing no solvent and composed mainly of a liquid epoxy resin as a binder has been used, or an electroconductive paste containing a small amount of a solvent has been used depending on the size of the holes.

The epoxy resin, however, is disadvantageous in that the electric resistance of the electroconductive paste composed mainly of the epoxy resin is difficult to reduce because the degree of thermal shrinkage on curing of the epoxy resin is lower than that of phenolic resins and the like.

This disadvantage can be removed by reducing the resistance by increasing the proportion of electroconductive powder in the electroconductive paste or using highly electroconductive metal powder such as silver. However, in this case, the electroconductive paste becomes expensive.

On the other hand, there is an electroconductive paste composed mainly of a phenolic resin. This electroconductive paste is superior in electroconductivity to the electroconductive paste composed. mainly of the epoxy resin but is poor in filling properties into the holes because of its high viscosity.

Figure 5:
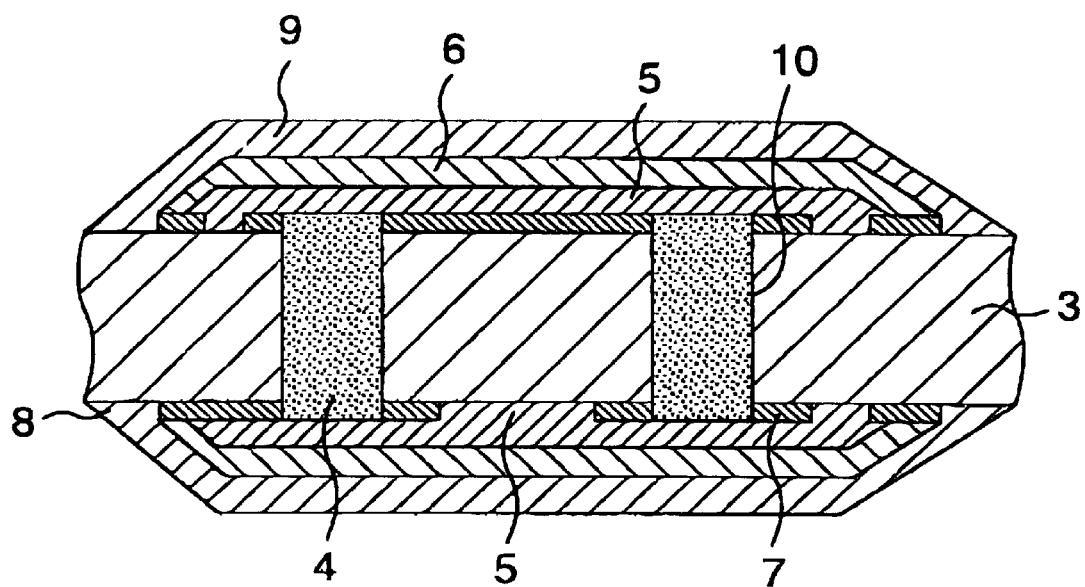
FIG. 5 is a cross-sectional view of a conventional through-hole wiring board.

When an electroconductive layer is formed in each through-hole by use of an electroconductive paste, filling the through-hole with an electroconductive paste containing a large amount of a solvent unavoidably results in the formation of voids in the through-hole owing to drying of the solvent, Furthermore, when the electroconductive layer is formed by the above-mentioned method shown in FIG. 3, the formation undesirably entails a high cost. Therefore, a multilayer circuit board obtained by, as shown in FIG. 5, forming insulating layers 5 on surfaces of a substrate 3, ends of through-holes filled with an electroconductive paste, copper foil lands 7 and a part of copper foil circuits 8 and forming electroconductive material printed circuits (hereinafter referred to as printed circuits) on the insulating layers 5 by use of an electroconductive material (a jumper electroconductive paste), is disadvantageous in that voids in the through-holes should be removed to increase the reliability on connection of the through-holes 10 to the copper foil lands 7, the copper foil circuits 8 and the printed circuits. In FIG. 5, numeral 4 denotes an electroconductive layer, numeral 6 a jumper circuit, and numeral 9 an overcoat layer.

Figure 6:
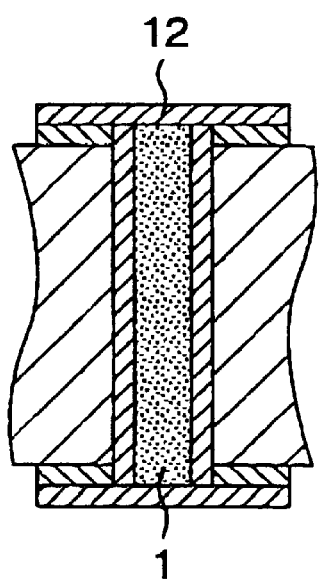
FIG. 6 is a cross-sectional view showing a state in which a cover plated film is formed on an end of electroconductive paste filling through-holes.

When a multilayer circuit board is produced by imparting electroconductivity to through-holes by use of a plated copper film formed on the inner surface of each through-hole, the above-mentioned disadvantage can be removed by forming the plated copper film on the inner surface of each through-hole, and then forming a cover plated film 12 on an electroconductive paste 1 filling the through-hole, as shown in FIG. 6. This process, however, is not desirable because it requires an increased number of steps and entails a high cost.

Figure 7:
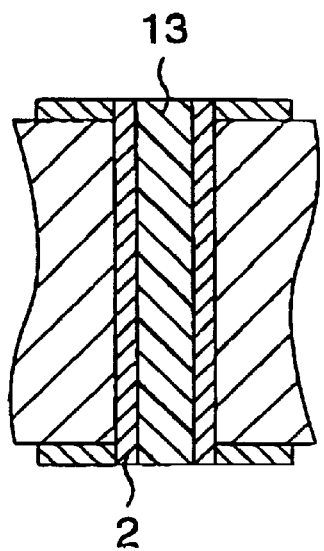
FIG. 7 is a cross-sectional view showing a state in which through-holes are connected by plating and the spaces in he through-holes is filled with a resin composition.

There is another process comprising, as shown in FIG. 7, forming a plated copper film 2 on the inner surface of each through-hole to form an electroconductive layer and filling the space with a resin 13. This process is also disadvantageous in that it entails a high cost because it requires an increased number of steps.

There is still another process comprising filling through-holes with a voidless or substantially voidless electroconductive material to assure the electroconductivity of the through-holes and then forming insulating layers and printed circuits on surfaces of a substrate. This process is disadvantageous in that the reliability on connection is low because the electroconductive material filling the through-holes and copper foil land portions are connected on the edge sections of the copper foils. To avoid this trouble, it is sufficient that the above-mentioned cover plated film is formed. This method, however, is not desirable because it requires an increased number of steps and entails a high cost.

In addition, when a multilayer circuit board is produced by using a silver through-hole wiring board having through-holes filled with a silver electroconductive material (a silver paste) containing a solvent, and forming insulating layers and printed circuits on surfaces of the wiring board, voids formed in the through-holes deteriorate the reliability. That is, when ionic impurities remain in the voids in a washing step or the like, the resistance to migration is decreased. In the case of the silver through-hole wiring board, the silver paste is formed thick on silver foil lands in some cases. The height of the silver paste formed thick hinders mounting of parts in some cases.

The present invention solves the problems described above. Its preferable embodiments are as follows.

(1) A through-hole wiring board comprising through-holes passing through a substrate and filled with an electroconductive material; copper foil lands and copper foil circuits formed on surfaces of the substrate; insulating layers formed on the copper foil circuits and between necessary portions of the copper foil lands and the copper foil circuits; and printed circuits formed by another electroconductive material having a different composition from that filling the through-holes on a part of the copper foil circuits, and the copper foil lands and the insulating layers except for unnecessary portions for electroconductivity; wherein the printed circuits and ends of the through-holes are electrically connected with an electroconductive material having a different composition from that filling the through-holes.

(2) A through-hole wiring board according to the above item (1), wherein the electroconductive material filling the through-holes is a voidless or substantially voidless electroconductive material.

(3) A through-hole wiring board according to the above item (2), wherein the electroconductive material filling the through-holes comprises substantially spherical electroconductive powder, and the printed circuits formed on the insulating layers are an electroconductive material comprising composite electroconductive powder of silver and copper and silver powder.

(4) A through-hole wiring board according to any one of the above items (1) to (3), wherein the electroconductive material filling the through-holes or the electroconductive material for forming the printed circuits is a pasty electroconductive material (an electroconductive paste).

(5) A through-hole wiring board according to the above item (4), wherein the electroconductive paste comprises a binder and electroconductive powder, and the main constituents of the binder are an alkoxy group-containing resol-type phenolic resin, a liquid epoxy resin and a curing agent for these resins.

(6) A through-hole wiring board according to the above item (4), wherein the electroconductive paste comprises a binder and electroconductive powder and has a specific gravity of 3 to 7.5.

(7) A through-hole wiring board according to the above item (6), wherein the proportions of the binder and the electroconductive powder as solids in the electroconductive paste are such that the volume ratio of the binder to the electroconductive powder is 35:65 to 65:35.

(8) A through-hole wiring board according to the above item (6) or (7), wherein the main constituents of the binder are an alkoxy group-containing resol-type phenolic resin, a liquid epoxy resin and a curing agent for these resins.

(9) A through-hole wiring board according to the above item (5) or (8), wherein the alkoxy group-containing resol-type phenolic resin is a resol-type phenolic resin substituted by one or more alkoxy groups of 1 to 6 carbon atoms.

(10) A through-hole wiring board according to the above item (5), (8) or (9), wherein the alkoxy group-containing resol-type phenolic resin is one which has an alkoxylation ratio of 5 to 95%.

(11) A through-hole wiring board according to the above item (5), (8), (9) or (10), wherein the alkoxy group-containing resol-type phenolic resin has a weight average molecular weight of 500 to 200,000.

(12) A through-hole wiring board according to any one of the above items (5) to (11), wherein the electroconductive powder is one of or a mixture of two or more of silver, copper and silver-coated copper powder.

(13) A through-hole wiring board according to any one of the above items (5) to (12), wherein the electroconductive powder is disagglomerated spherical or substantially spherical electroconductive powder.

(14) A through-hole wiring board according to any one of the above items (5) to (13), wherein the proportions of the binder and the electroconductive powder as solids in the electroconductive paste are such that the weight ratio of the binder to the electroconductive powder is 3:97 to 17:83.

(15) A through-hole wiring board according to any one of the above items (5) to (14), wherein the blending proportions of the alkoxy group-containing resol type phenolic resin and the liquid epoxy resin are such that the weight ratio of the alkoxy group-containing resol type phenolic resin to the liquid epoxy resin is 10:90 to 90:10.

(16) A through-hole wiring board according to the above item (4), wherein the electroconductive paste comprises electroconductive powder and a binder; the proportions of the electroconductive powder and the binder as solids in the electroconductive paste are such that the volume ratio of the electroconductive powder to the binder is 45:55 to 79:21 and that the weight ratio of the electroconductive powder to the binder is 88:12 to 96.5:3.5; and the glass transition point (Tg) of a cured product of the electroconductive paste is 40° to 180° C.

(17) A through-hole wiring board according to the above item (16), wherein the binder is composed mainly of an epoxy resin composition and a curing agent for the composition, and the epoxy equivalent of the epoxy resin is 160 to 330 g/eq.

(18) A through-hole wiring board according to the above item (17), wherein the epoxy resin composition comprises an epoxy resin which is liquid at ordinary temperatures and a flexibilizer, and the blending proportions of the epoxy resin and the flexibilizer are such that the weight ratio of the epoxy resin to the flexibilizer is 40:60 to 90:10.

(19) A through-hole wiring board according to any one of the above items (16) to (18), wherein the electroconductive powder is silver-plated copper powder or copper alloy powder, which has a specific surface area of 0.1 to 1.0 m²/g, an aspect ratio of 1 to 1.5 and an average particle size (an average length of particles) of 1 to 20 μm and the electroconductive powder is substantially spherical electroconductive powder in which the exposed area of the copper powder or the copper alloy powder is 10 to 60%. Metals contained in the copper alloy are a small or trace amount of Sn, Ni, Zn, Co, Mn, Fe, Pb, S, etc.

(20) A through-hole wiring board according to any one of the above items (16) to (19), wherein the electroconductive powder is copper powder or copper alloy powder, the surface of which is substantially coated with silver with a portion thereof exposed, and the shape of the electroconductive powder is substantially spherical.

(21) A through-hole wiring board according to the above item (4), wherein the electroconductive paste comprises electroconductive powder, a binder and a solvent; the electroconductive powder is copper powder or copper alloy powder, the surface of which is substantially coated with silver with a portion thereof exposed; and the electroconductive powder has a flake-like or flaky shape, an aspect ratio of 3 to 20 and an average particle size (an average length of particles) of 5 to 30 μm.

(22) A through-hole wiring board according to the above item (21), wherein the exposed area of the copper powder or copper alloy powder is 10 to 60%

(23) A through-hole wiring board according to the above item (21) or (22), wherein the solvent is contained in an amount of 2 to 20 wt % based on the weight of the electroconductive paste.

(24) A through-hole wiring board according to any one of the above items (21) to (23), wherein the boiling point of the solvent is 150° to 260° C.

(25) A through-hole wiring board according to the above item (4), wherein the electroconductive paste comprises a binder and electroconductive powder, and the electroconductive powder has a substantially spherical shape, a tap density of 4.5 to 6.2 g/cm³ and a relative density of 50 to 68%.

(26) A through-hole wiring board according to the above item (25), wherein the electroconductive powder is copper powder or copper alloy powder, the surface of which is substantially coated with silver with a portion thereof exposed; and the shape of the electroconductive powder is substantially spherical.

(27) A through-hole wiring board according to the above item (25) or (26), wherein the electroconductive powder is copper powder or copper alloy powder, which has an aspect ratio of 1 to 1.5 and an average article size (an average length of particles) of 1 to 20 μm, and the electroconductive powder is substantially spherical electroconductive powder in which the exposed area of the copper powder or the copper alloy powder is 10 to 60%.

(28) A through-hole wiring board according to any one of the above items (21) to (27), wherein the proportions of the electroconductive powder and the binder as solids in the electroconductive paste are such that the weight ratio of the electroconductive powder to the binder is 88:12 to 96.5:3.5.

(29) A through-hole wiring board according to any one of the above items (1) to (28), wherein the electroconductive material filling the through-holes described in the above item (1) is the electroconductive paste described in any one of the above items (5) to (15); the copper foil lands described in the above item (1) to which chip components are to be attached with solder are connected to ends of the electroconductive paste filling the through-holes by conducting printing on the copper foil lands by use of the electroconductive paste described in any one of the above items (16) to (28); and the copper foil lands described in the above item (1) to which no chip component is to be attached with solder are connected to ends of the electroconductive paste filling the through-holes by conducting printing on these copper foil lands by use of the electroconductive paste prepared from composite electroconductive powder of silver and copper and silver powder and described in the above item (3).

The aspect of the invention described as the above embodiment (1) provides a through-hole wiring board which permits easy formation of an electrical connection of through-holes, has a high reliability on connection, and has a small thickness of an electroconductive material formed on copper foil lands.

The aspect of the invention described as the embodiment (2) provides a through-hole wiring board having an especially high reliability on connection, according to the aspect of the invention described as the embodiment (1).

The aspect of the invention described as the embodiment (3) provides a through-hole wiring board having advantages in that the filling properties of an electroconductive material into through-holes and the resistance to migration of printed circuits formed on insulating layers are good, in addition to the advantages of the aspect of the invention described as the embodiment (1).

Each of the aspects of the invention described as the embodiments (4), (5) and (6) provides a through-hole wiring board using an electroconductive paste excellent in electroconductivity and filling properties into through-holes or non-through-holes.

Each of the aspects of the invention described as the embodiments (7) to (15) provides a through-hole wiring board using an electroconductive taste excellent in filling properties into through-holes or non-through-holes and electroconductivity-improving effect.

The aspect of the invention described as the embodiment (16) provides a through-hole wiring board using an electroconductive paste excellent in solder-ability.

Each of the aspects of the invention described as the embodiments (17) to (20) provides a through-hole wiring board using an electroconductive paste having an excellent solderability-improving effect.

The aspect of the invention described as the embodiment (21) provides a through-hole wiring board using an electroconductive paste excellent in solderability and electroconductivity.

The aspect of the invention described as the embodiment (22) provides a through-hole wiring board using an electroconductive paste excellent in solderability-improving effect and resistance to migration.

Each of the aspects of the invention described as the embodiments (23) and (24) provides a through-hole wiring board using an electroconductive paste having the effects and resistance to migration described in the embodiments (21) and (22) and an excellent work-efficiency.

The aspect of the invention described as the embodiment (25) provides a through-hole wiring board using an electroconductive paste excellent in solderability.

Each of the aspects of the invention described as the embodiments (26) to (28) provides a through-hole wiring board using an electroconductive paste excellent in solderability-improving effect.

The aspect of the invention described as the embodiment (29) provides a through-hole wiring board in which solder wettability for copper foil lands on the side on which chip components are to be soldered is good, connecting properties for these copper foil lands are excellent, and the reliability on connection to copper foil lands on the side on which no chip component is to be soldered is high.

The materials used in the present invention, the constitution of the present invention, and the like are explained below in detail.

As the substrate used in the present invention, a copper-clad laminate is preferably used. The copper-clad laminate includes paper-phenol substrates, glass-epoxy substrates, glass-epoxy composite substrates, etc. The thickness of the substrate is not particularly limited. When the glass-epoxy substrate or glass-epoxy composite substrate is used, the thickness is preferably 1.6 mm, more preferably 1.2 mm. The thickness is most preferably 0.4 to 1.0 mm from the viewpoint of the light weight, small thickness, small length and stall size of the through-hole wiring board.

The diameter of the through-holes formed in the substrate is preferably 0.6 mm or less, more preferably 0.5 mm or less, most preferably 0.2 to 0.4 mm.

The electroconductive material to fill the through-holes is preferably used after being made into paste. The electroconductive powder used in said electroconductive material is preferably substantially spherical because such a shape imparts good print-ability and filling properties.

As the aforesaid electroconductive powder, there is preferably used silver-coated copper powder or silver-coated copper alloy powder, in which the surface of copper powder or copper alloy powder has been substantially coated with silver with a portion thereof exposed. Employment of the silver-coated copper alloy powder is especially preferable because it can prevent oxidation and can suppress the migration. If there is used copper powder or copper alloy powder, the whole surface of which has been coated with silver without exposing a portion of the surface, the solderability is deteriorated, so that the accomplishment of the object of the present invention tends to become impossible and that the resistance to migration tends to be decreased.

As the copper powder or the copper alloy powder, powder produced by an atomizing method is preferably used. The particle size of the copper powder or copper alloy powder is preferably as small as possible. The copper powder or copper alloy powder is preferably powder having an average particle size in a range of 0.1 to 20 μm, more preferably 1 to 20 μm, most preferably 1 to 10 μm.

The exposed area of the silver-plated copper powder or copper alloy powder ranges preferably from 10 to 60%, more preferably from 10 to 50%, most preferably from 10 to 30%, from the viewpoint of solderability, the oxidation of the exposed portion, electroconductivity, etc.

For coating the surface of copper powder or copper alloy powder with silver, there are methods such as substitutional plating, electroplating, electroless plating, etc. The coating is preferably conducted by substitutional plating because the substitutional plating gives a strong adhesion between the copper powder or copper alloy powder and silver and entails a low running cost.

The coating amount of silver on the surface of copper powder or copper alloy powder ranges preferably from 5 to 25 wt %, more preferably from 10 to 23 wt %, based on the weight of the copper powder or copper alloy powder from the viewpoint of resistance to migration, cost, the improvement of the electroconductivity, etc.

Electroconductive powder tends to have a high resistance when it has too small a number of contact points. In order to attain a high electroconductivity by increasing the contact areas of electroconductive particles with one another, it is preferable to change the shape of the particles to a flake-like or flaky shape by making an impact on the electroconductive powder. However, an electroconductive paste using flake-like or flaky electroconductive powder has a higher viscosity than does an electroconductive paste using substantially spherical electroconductive powder, so that its filling properties into holes is deteriorated. To reduce the viscosity, incorporating a large amount of a solvent is sufficient. The incorporation of a large amount of a solvent, however, causes a decrease in the thickness of a coating film of the electroconductive paste after curing by a thickness corresponding to the volume of the solvent. To make the surface of the coating film flake-like or flaky and even, its polishing is sufficient. The polishing, however, is not desirable because it decreases the film thickness. Therefore, an electroconductive paste using substantially spherical electroconductive powder is preferably used from the viewpoint of work-efficiency and the electroconductivity of the electroconductive paste.

As the electroconductive powder used in the electroconductive material to fill the through-holes, there is preferably used substantially spherical electroconductive powder obtained by forming a plated silver film on the surface of substantially spherical copper powder or copper alloy powder in order to increase the reliability on connection, and then carrying out a disagglomerating treatment for abolishing the agglomeration of particles of the electroconductive powder, to increase the tap density. One reason is that when the substantially spherical electroconductive powder is used, the contact resistance of particles of the electroconductive powder with one another is low. As said substantially spherical electroconductive powder, one which has a tap density of 55% or more in terms of relative density is preferably used because it can fill the through-holes densely. In addition, the electroconductive powder subjected to the disagglomerating treatment is preferable as electroconductive powder to fill holes with a small diameter because it has a higher bulk density than does agglomerated electroconductive powder not subjected to the disagglomerating treatment.

A method for disagglomerating electroconductive powder is not particularly limited. The disagglomeration can be carried out, for example, by charging agglomerated electroconductive powder and 1 kg of zirconia balls with a diameter of 0.5 to 2 mm into the container of a ball mill, and rotating the container for about 2 hours.

Since electroconductive powder subjected to silver plating tends to be agglomerated in plating and drying steps, its tap density is approximately 25 to 40% in terms of relative density. By carrying out the disagglomerating treatment described above, the tap density can be adjusted to 55% or more in terms of relative density, and it can be adjusted to 60% or more in terms of relative density under optimum conditions.

In addition, in order to increase the reliability on electroconductivity, substantially spherical electroconductive powder and flake-like or flaky and fine silver powder and/or silver fine powder having agglomerating properties are preferably used in combination. Besides them, substantially spherical electroconductive powder and flake-like or flaky silver-copper composite powder may be used together therewith. When the powders described above are used in combination, their proportions are preferably as follows: the flake-like or flaky and fine silver powder, the silver fine powder having agglomerating properties and/or the flake-like or flaky silver-copper composite powder are used in a total proportion of 5 to 75 parts by weight per 100 parts by weight of the substantially spherical electroconductive powder. When the total proportion of the flake-like or flaky and fine silver powder, the silver fine powder having agglomerating properties and/or the flake-like or flaky silver-copper composite powder is less than 5 parts by weight, the reliability on electroconductivity tends to be low. When this total proportion is more than 75 parts by weight, the electroconductivity is good but the viscosity is liable to be increased, so that the filling properties into the through-holes tends to be deteriorated.

As the substantially spherical electroconductive powder used in the present invention, electroconductive powder having a specific surface area of 0.1 to 1.0 $m^2/g$, an aspect ratio of 1 to 1.5 and an average particle size (an average length of particles) of 1 to 20 μm is preferably used. Employment of electroconductive powder having a specific surface area of 0.1 to 0.6 $m^2/g$, an aspect ratio of 1 to 1.3 and an average particle size (an average length of particles) of 1 to 10 μm is more preferable because such electroconductive powder has an excellent solderability-improving effect.

The above-mentioned specific surface area can be measured by the BET method, and the above-mentioned average particle size can be measured with a laser scattering type particle size distribution measuring apparatus. In the present invention, the average particle size was measured by using Master Sizer (mfd. by Malvern Instrument Ltd.) as the aforesaid apparatus.

The aspect ratio in the present invention refers to the ratio of length to breadth (length/ breadth) of particles of the electroconductive powder. In the present invention, particles of the electroconductive powder are thoroughly mixed with a curable resin having a low viscosity, and the mixture is allowed to stand to precipitate the particles and cure the resin as it is. The resulting cured product is vertically cut, and the shapes of particles which appear on the cut surface are observed under magnification by an electron microscope, For at least 100 particles, the ratio of length to breadth of each particle is calculated, and the average of the thus obtained values is taken as the aspect ratio, Here, the breadth is defined as follows. Combinations of two parallel lines touching the outside of any of the particles which appear on the aforesaid cut surface are selected so that the particle may be held between the two parallel lines. Of these combinations, a combination of two parallel lines the distance between which is the shortest is selected, and this distance is taken as the breadth. On the other hand, the length is defined as follows. Of combinations of two parallel lines which are perpendicular to the above-mentioned parallel lines for determining the breadth and touch the outside of any of the particles, a combination of two parallel lines the distance between which is the longest is selected, and this distance is taken as the length. The rectangle formed by the four lines described above has such a size that a particle can be contained therein exactly.

Concrete methods adopted in the present invention are described hereinafter.

In the above-mentioned portions which are other than the through-holes and are required to have a high electroconductivity, the following electroconductive pastes are preferably used. For example, as the electroconductive paste for printing on the copper foil lands which are connected to the ends of the through-holes and to which chip components are to be attached with solder and on the copper foil circuits adjacent to the copper foil lands, the electroconductive paste described in the embodiments (16) to (28) of the invention is preferably used. As the electroconductive paste for printing on the copper foil lands which are connected to the ends of the through-holes and to which no chip component is to be attached with solder and on the copper foil circuits adjacent to these copper foil lands, electroconductive paste prepared from the electroconductive material comprising composite electroconductive powder of silver and copper and silver powder and described in the embodiment (3) of the invention is preferably used. In the above-mentioned electroconductive paste for printing on the copper foil lands which are connected to the ends of the through-holes and to which chip components are to be attached with solder and on the copper foil circuits adjacent to the copper foil lands and the above-mentioned electroconductive paste for printing on the copper foil lands to which no chip component is to be attached with solder and the copper foil circuits adjacent to these copper foil lands, substantially spherical electroconductive powder may be used though flake-like or flaky electroconductive powder obtained by making an impact on non-flake-like or flaky electroconductive powder is preferably used. The flake-like or flaky shape makes it possible to increase the contact area of electroconductive particles with one another to impart a high electroconductivity.

As the electroconductive material used in the printed circuits (jumper circuits) formed on the ends of the through-holes other than the above-mentioned ends, a part of the copper foil circuits, and the copper foil lands and the copper foil lands and the insulating layers except for unnecessary portions for electroconductivity, an electroconductive material having a different composition from that filling the through-holes should be used. Flake-like or flaky electroconductive powder is preferably used also in this electroconductive material.

As the flaky electroconductive powder used in the present invention, i.e., the flake-like or flaky electroconductive powder used in the embodiment (21) of the invention, there should be used electroconductive powder having an aspect ratio of 3 to 20 and an average particle size (an average length of particles) of 5 to 30 μm, preferably electroconductive powder having an aspect ratio of 3 to 15 and an average particle size (an average length of particles) of 5 to 20 μm. When the aspect ratio is less than 3, the electroconductivity is low. When the aspect ratio is more than 20, the work-efficiency is low. When the average particle size (the average length of particles).is less than 5 μm, the work-efficiency is low. When the average particle size (the average length of particles) is more than 30 μm, a mesh or the like used in printing is plugged, resulting in a low work-efficiency.

The average particle size referred to here can also be measured with the laser scattering type particle size distribution measuring apparatus explained above. In the present invention, the average particle size was measured by using Master Sizer (mfd. by Malvern Instruments Ltd.) as the aforesaid apparatus.

As the electroconductive powder used in the electroconductive material used in the portions described above, there is preferably used silver-coated copper powder or silver-coated copper alloy powder, in which the surface of copper powder or copper alloy powder is substantially coated with silver with a portion thereof exposed, as in the electroconductive powder to fill the through-holes. Employment of the silver-coated copper alloy powder is especially preferable because it can prevent oxidation and can suppress the migration. If there is used copper powder or copper alloy powder, the whole surface of which has been coated with silver without exposing a portion of the surface, the solderability is deteriorated, so that the achievement of the object of the present invention tends to become impossible and that the resistance to migration tends to be decreased.

The exposed area of the silver-plated copper powder or copper alloy powder ranges preferably from 10 to 60%, more preferably from 10 to 50%, most preferably from 10 to 30%, from the viewpoint of solderability, the oxidation of the exposed portion, electroconductivity, etc.

For coating the surface of copper powder or copper alloy powder with silver, there are methods such as substitutional plating, electroplating, electroless plating, etc. The coating is preferably conducted by substitutional plating because the substitutional plating gives a strong adhesion between the copper powder or copper alloy powder and silver and entails a low running cost.

The coating amount of silver on the surface of copper powder or copper alloy powder ranges preferably from 5 to 25 wt %, more preferably from 10 to 23 wt %, based on the weight of the copper powder or copper alloy powder from the viewpoint of resistance to migration, cost, the improvement of the electroconductivity, etc.

On the other hand, as the silver powder used in combination with the composite electroconductive powder of silver and copper, one which has a flake-like or flaky shape is preferably used. The average article size of the silver powder is preferably 20 $\mu$m or less, more preferably 10 $\mu$m or less, most preferably 3 to 0.2 $\mu$m.

As to the proportions of the composite electroconductive powder of silver and copper and the silver powder, the silver powder is preferably blended in a proportion of 25 to 150 parts by weight per 100 parts by weight of the composite electroconductive powder of silver and copper. When the proportion of the silver powder is less than 25 parts by weight, the resistance to migration is good but the reliability on electroconductivity tends to be deteriorated. When the proportion is more than 150 parts, the balance between the resistance to migration and other properties tends to become unsatisfactory.

When only copper powder is used as the electroconductive material for forming the printed circuits on the insulating layers, the resistance to migration is good but the electroconductivity tends to be deteriorated in a high-temperature high-humidity bias test or a gas-phase thermal shock cycle test, so that the electric resistance is increased, resulting in causing disconnection easily. When a wiring board is produced by forming circuits by printing using an electroconductive material composed of only copper powder, bending the wiring board results in an extremely increased resistance value. When such wiring boards are mass-produced, they are bent during the mass production in some cases and hence tend to be deteriorated in reliability on circuit resistance.

In the present invention, a method for filling the through-holes passing through the substrate with the electroconductive material (the electroconductive paste) is as follows. Through-holes are formed at desirable positions of a substrate having copper foil attached to each side of the substrate, so as to pass through the substrate, and the through-holes are filled with the electroconductive paste by a method such as a printing method, a squeeze method or the like, followed by drying and semi-curing or curing. Then, the electroconductive material cured product adhering to the copper foils in the form of raised portions on both sides of substrate is removed by polishing. By conducting the polishing before forming copper foil circuits and the like by etching the copper foils, remaining of polishing powder and damage to the copper foil circuits can be prevented. Furthermore, the productivity is good because the polishing is conducted on the whole surfaces of the copper foils.

Even if dents are formed below the surface of the copper foil by excessive polishing of the electroconductive material (the electroconductive paste) at the ends of the through-holes, the reliability on electroconductivity is high because according to the present invention, the electroconductive material at the ends of the through-holes and the copper foil lands are connected with the electroconductive material.

When fins formed around the through-holes are removed by a method such as etching after the formation of the through-holes passing the substrate, the reliability on the connection between the end of the above-mentioned electroconductive material filling the through-holes and the copper foil lands is further increased.

In the present invention, the copper foil lands and the copper foil circuits can be formed by a method comprising forming a pattern on each of the copper foils of a double-sided copper-clad laminate board by use of a resist for etching and conducting patterning by use of an etching solution.

Also when the through-holes are previously formed, the copper foil lands and the copper foil circuits can be formed by an etching method after forming a resist pattern on the through-holes by a so-called tenting method.

As a material used in the insulating layers, a thermosetting insulating material comprising an epoxy resin composition is preferably used from the viewpoint of heat resistance, moisture resistance, etc., though an insulating material having both thermosetting property and UV-setting property may be used.

When the use environment is mild and a voltage at which a printed circuit board is produced is low, a UV-setting insulating material may be used.

In the present invention, as a binder incorporated into each of the electroconductive material to fill the through-holes and the electroconductive material used for printing on a part of the copper foil circuits, and the copper foil lands and the insulating layers except for unnecessary portions for electroconductivity, there is preferably used a thermosetting resin composition comprising an epoxy resin and a phenolic resin or either a monoepoxide or a polyethylene glycol, which is added in order to reduce the viscosity, a coupling agent, a curing agent and the like.

The ratio between the epoxy resin and the phenolic resin is as follows. In the electroconductive material to fill the through-holes, a composition having a high content of the epoxy resin is preferably used because the reduction of the viscosity and the amount of a solvent are desirable. On the other hand, in the electroconductive material used for printing on the copper foil lands and the insulating layers, a composition having a high content of the phenolic resin is preferably used in order to reduce the resistance of the printed circuits. This composition may contain a solvent in a proportion of 10 to 25 wt % so long as the solvent does not cause oozing during printing.

As the phenolic resin, well-known phenolic resins of novolak type, resol type or the like may be used. The proportions of the epoxy resin and the phenolic resin are preferably such that the weight ratio of the epoxy resin to the phenolic resin ranges from 10:90 to 90:10, more preferably from 10:90 to 60:40. When the proportion of the epoxy resin is less than 10 wt %, the adhesive properties to the copper foils tend to be deteriorated. When the proportion of the epoxy resin is more than 90 wt %, the electroconductivity tends to be deteriorated.

An electroconductive paste using a phenolic resin has a higher electroconductivity than does an electroconductive paste using an epoxy resin. The reason is that since the degree of shrinkage on curing of the phenolic resin is higher than that of the epoxy resin, the volume reduction of the electroconductive material using the phenolic resin is larger, so that the contact area and probability for contact of particles of electroconductive powder with one another are increased.

Although a phenolic resin is indispensable for an electroconductive paste which is required to have a high electroconductivity, its incorporation into the electroconductive paste increases the viscosity of the electroconductive paste and deteriorates the filling properties into holes. In particular, the incorporation deteriorates the filling properties into holes with a small diameter. This problem can be solved by using an alkoxy group-containing resol type phenolic resin.

An electroconductive paste using an alkoxy group-containing resol type phenolic resin has a lower viscosity than does an electroconductive paste using a well-known phenolic resin of novolak type, resol type or the like, and has an electroconductivity equal to or higher than that of the latter electroconductive paste, when the contents of the alkoxy group-containing resol type phenolic resin and the well-known phenolic resin in the electroconductive pastes, respectively, are the same.

As the alkoxy group-containing resol type phenolic resin, a resol type phenolic resin substituted by one or more alkoxy groups of 1 to 6 carbon atoms is especially preferable from the viewpoint of the viscosity, filling properties into holes and electroconductivity of an electroconductive paste using this phenolic resin. The alkoxylation ratio of the alkoxy group-containing resol type phenolic resin, i.e., the percentage of alkoxylated methylol groups based on the total number of methylol groups ranges preferably from 5 to 95%, more preferably 10 to 85%, from the viewpoint of the viscosity, filling properties into holes and electroconductivity of the electroconductive paste.

The number of alkoxy groups in the alkoxy group-containing resol type phenolic resin ranges preferably from 0.1 to 2, more preferably from 0.3 to 1.5, most preferably 0.5 to 1.2, per benzene ring. The alkoxylation ratio and the number of alkoxy groups can be measured by nuclear magnetic resonance spectrum analysis (hereinafter referred to as NMR method).

In the present invention, the weight average molecular weight of the alkoxy group-containing resol type phenolic resin ranges preferably from 500 to 200,000, more preferably from 700 to 120,000, from the viewpoint of the viscosity, filling properties into holes, shelf life and electroconductivity of the electroconductive past, and the curing property of the binder. The weight average molecular weight can be determined by measurement by gel permeation chromatography and expression of the measured value in terms of standard polystyrene.

In the binder used in the electroconductive material used for printing on the insulating layers, the phenolic resin content is preferably high because the electroconductivity is preferably as high as possible. In the binder, an alkoxy group-containing resol type phenolic resin having a high viscosity is preferably used in order to prevent oozing during printing and drying. The weight average molecular weight of the alkoxy group-containing resol type phenolic resin ranges preferably from 5,000 to 200,000, more preferably from 700 to 120,000. When a phenolic resin having a high molecular weight is used, the viscosity of the electroconductive material is rapidly increased with the evaporation of a solvent, during drying after printing by use of the electroconductive material. Therefore, even if the viscosity is decreased with heating, the degree of the viscosity decrease is low when the molecular weight is high. Thus, the electroconductive material is characterized in that its oozing is prevented, so that a wiring board having a high reliability on insulation can be obtained.

The blending proportions of the alkoxy group-containing resol type phenolic resin and a liquid epoxy resin are preferably such that the weight ratio of the alkoxy group-containing resol type phenolic resin to the liquid epoxy resin ranges from 10:90 to 90:10, more preferably from 40:60 to 90:10, from the viewpoint of the electroconductivity and the viscosity and filling properties into holes of the electroconductive paste.

The epoxy resin is preferably liquid at ordinary temperatures. An epoxy resin which crystallizes at ordinary temperatures can be prevented from crystallizing, by mixing with an epoxy resin which is liquid at ordinary temperatures. The epoxy resin which is liquid at ordinary temperatures and is used in the present invention includes, for example, epoxy resins which are solid at ordinary temperatures but can be made stably liquid at ordinary temperatures by mixing with an epoxy resin which is liquid at ordinary temperatures In the present specification, the term "ordinary temperatures" or "room temperature" means a temperature around 25° C.

As the epoxy resin, well-known ones can be used, and there can be exemplified compounds containing two or more epoxy groups in the molecule, for example, aliphatic epoxy resins such as polyglycidyl ethers, dihydroxynaphthalene diglycidyl ether, butanediol diglycidyl ether, neopentyl glycol diglycidyl ether, etc., which are obtained by reacting bisphenol A, bisphenol AD, bisphenol F, a novlak or a cresol novolak with epichlorohydrine, heterocyclic epoxy compounds such as diglycidylhydantoin, etc.; and alicyclic epoxy resins such as vinylcyclohexenedioxide, dicyclopentadienedioxide, alicyclic diepoxy adipate, etc.

If necessary, a flexibilizer is used. As the flexibilizer, well-known ones may be used. There can be exemplified compounds having only one epoxy group in the molecule, for example, conventional epoxy resins such as n-butyl glycidyl ether, versatic acid glycidyl ether, styrene oxide, ethylhexyl glycidyl ether, phenyl glycidyl ether, cresyl glycidyl ether, butyl phenyl glycidyl ether, etc.

The above-exemplified epoxy resins may be used singly or as a mixture thereof. The above-exemplified flexibilizers may also be used singly or as a mixture thereof.

As the curing agent incorporated into the binder, there can be used amines such as menthenediamine, isophoronediamine, m-phenylenediamine, diaminodiphenylmethane, diaminodiphenylsulfone, methylenedianiline, etc.; acid anhydrides such as phthalic anhydride, trimellitic anhydride, pyromellitic anhydride, succinic anhydride, tetrahydrophthalic anhydride, etc.; compound type curing agents such as imidazole, dicyandiamide, etc.; and resin type curing agents such as polyamide resins, phenolic resins, urea resins, etc. If necessary, the above-exemplified curing agents may be used in combination with curing agents such as latent amine curing agents. There may be added compounds generally known as curing accelerators for epoxy resins and phenolic resins, such as tertiary amines, imidazoles, triphenylphosphine, tetraphenyl phosphenyl borate, etc.

The content of the curing agent ranges preferably from 0.1 to 25 parts by weight, more preferably from 1 to 20 parts by weight, most preferably from 1 to 10 parts by weight, per 100 parts by weight of the epoxy resin from the viewpoint of the glass transition point (Tg) of a cured product of the electroconductive paste.

The binder used in the present invention is obtained by uniformly mixing the materials described above and optionally a thixotropic agent, coupling agent, defoaming agent, powder finishing agent, anti-setting agent and the like. The total content of the thixotropic agent, coupling agent, defoaming agent, powder finishing agent, anti-setting agent and the like which are added if necessary, ranges preferably from 0.01 to 1 wt %, more preferably from 0.03 to 0.5 wt %, based on the weight of the electroconductive paste.

The specific gravity of the electroconductive paste used in the present invention ranges preferably from 3 to 7.5, more preferably from 3.5 to 6.5. When the specific gravity is less than 3, no high electroconductivity tends to be attained because of the low proportion of the electroconductive powder. On the other hand, when the specific gravity is more than 7.5, the proportion of the electroconductive powder is high but the proportion of the binder and the like is low, so that the filling properties into holes tend to be deteriorated.

For adjusting the specific gravity of the electroconductive paste to a value in the above range, the volume ratio between the binder and the electroconductive powder as solids in the electroconductive paste ranges preferably from 35:65 to 65:35, more preferably from 40:60 to 60:40.

The weight ratio between the binder and the electroconductive powder ranges preferably from 3:97 to 17:83, more preferably from 5:95 to 15:85, most preferably from 7:93 to 13:87. When the proportion of the electroconductive powder is less than 83 wt %, the electroconductivity tends to be deteriorated. When the proportion of the electroconductive powder is more than 97 wt %, the viscosity, the adhesive force and the strength of the electroconductive paste are lowered, so that the reliability tends to be deteriorated, In the electroconductive paste described in any of the embodiments (16), (21) and (25), the volume ratio between the binder and the electroconductive powder as solids in the electroconductive paste ranges preferably from 55:45 to 21:79, more preferably from 50:50 to 28:72.

The weight ratio between the binder and the electroconductive powder ranges preferably from 3.5:96.5 to 12:88, more preferably from 5:95 to 10:90. When the proportion of the electroconductive powder is below the above range, the solderablity is deteriorated. When the proportion of the electroconductive powder is above the above range, the viscosity of the electroconductive paste is extremely increased, so that the production of the electroconductive paste becomes difficult and that the work-efficiency in coating of the electroconductive paste is decreased.

In the present invention, the glass transition point (hereinafter referred to as Tg) of a cured product of the electroconductive paste described above is preferably 40° to 180° C., more preferably 40° to 140° C. When Tg is outside the range of 40° to 180° C., soldering directly on a coating film of the electroconductive paste tends to be impossible.

In order to adjust Tg of a cured product of the electroconductive paste to a temperature in the range of 40° to 180° C., it is preferable to use a binder composed mainly of an epoxy resin composition and a curing agent for the composition wherein the epoxy equivalent of the epoxy resin ranges 160 to 330 g/eq, more preferably 160 to 250 g/eq.

As the aforesaid epoxy resin composition, a composition containing a flexibilizer in addition to the epoxy resin is preferably used. The blending proportions of the epoxy resin and the flexibilizer are preferably such that the weight ratio of the epoxy resin to the flexibilizer ranges from 40:60 to 90:10, more preferably from 50:50 to 80:20.

In the present invention, in order to make the electroconductive paste more similar to copper foil, electroconductive powder having high filling properties is preferably used as the electroconductive powder used in the electroconductive paste. Specifically, the electroconductive powder preferably has a substantially spherical shape and a tap density of 4.5 to 6.2 g/cm$^3$ and a relative density of 50 to 68%, more preferably a tap density of 4.9 to 6.2 g/cm$^3$ and a relative density of 55 to 68%. When the tap density or the relative density is below the above range, the filling properties are low and the proportion of the binder is increased. On the other hand, when the tap density or the relative density is above the above range, inexpensive production of the electroconductive powder tends to be very difficult.

The above-mentioned tap density was determined by placing a suitable amount of the electroconductive powder in a measuring cylinder, carrying out 1,000 runs of tapping operation, and calculating the tap density from the weight of the electroconductive. powder placed in the measuring cylinder and the volume of the electroconductive powder shown by the measuring cylinder after the 1,000 runs of tapping operation. The relative density was calculated by the following equation:

$$\text{Relative density } (\%) = (\text{tap density/true density}) \times f \times 100 \quad [\text{Equation 1}]$$

wherein f is a correction factor obtained on the basis of measured values.

In general, as an electroconductive paste to fill holes, a solventless electroconductive paste containing no solvent is used because the formation of voids in through-holes is not desirable. However, the incorporation of a solvent is preferable because it improves the electroconductivity and reduces the nonuniformity of the electroconductivity.

After coating and printing and after curing by heat treatment, the degree of volume decrease of an electroconductive paste containing a solvent is higher than that of an electroconductive paste containing no solvent, by the volume of the solvent contained. During the heat treatment, the viscosity of the electroconductive paste containing a solvent is decreased more remarkably than that of the electroconductive paste containing no solvent, so that the electroconductive powder contained in the former electroconductive paste becomes dense in a layer of the electroconductive material. For these causes, the electroconductive paste containing a solvent have a higher and more uniform electroconductivity than does the electroconductive paste containing no solvent.

An electroconductive paste using flake-like or flaky electroconductive powder has a higher viscosity and a lower work-efficiency than does an electroconductive paste using substantially spherical electroconductive powder when the compositions of these pastes are the same. In the present invention, this problem can be solved by adding a solvent. When a solvent is added, the thickness of a coating film of the resulting electroconductive paste is decreased to a degree corresponding to the volume of the solvent. When, for example, a step of polishing the surface of the coating film is carried out, the small thickness of the coating film is not desirable. This problem, however, can be avoided by applying the electroconductive paste two or more times to form a thick coating film.

As the solvent used, a solvent capable of causing a large decrease in the viscosity of the electroconductive paste during heat treatment is preferable. There can be exemplified solvents having an evaporation rate of 28 or less exclusive of zero when the evaporation rate of butyl acetate is taken as 100, and having a boiling point of 150° to 260° C., which are, for example, dipropylene glycol methyl ether, dipropylene glycol ethyl ether, dipropylene glycol butyl ether, dipropylene glycol isopropylmethyl ether, dipropylene glycol isopropylethyl ether, tripropylene glycol methyl ether, propylene glycol t-butyl ether, propylene glycol ethyl ether acetate, ethylene glycol ethyl ether acetate, ethylene glycol butyl ether, diethylene glycol methyl ether, triethylene glycol methyl ether, diethylene glycol ethyl ether, ethylene glycol butyl ether, diethylene glycol butyl ether, 3-methyl-3-methoxybutanol, 3-methyl-3-methoxybutyl ether, ethyl lactate, butyl lactate, ethyl carbitol, butyl carbitol, benzyl alcohol, butyl carbitol acetate, etc.

As the solvent added, one of or optionally a mixture of two or more of the above-exemplified solvents is used. The content of the solvent ranges preferably from 0.01 to 20 wt %, more preferably from 1 to 20 wt %, still more preferably from 2 to 20 wt %, most preferably from 2 to 7.5 wt %, based on the weight of the electroconductive paste from the viewpoint of electroconductivity, work-efficiency, the viscosity of the electroconductive paste, the thickness of a coating film, filling properties into holes, etc.

The boiling point of the solvent ranges preferably from 150° to 260° C., more preferably from 170° to 240° C., from the viewpoint of the viscosity stability of the electroconductive paste during operations and the time of drying the solvent.

The electroconductive paste used in the present invention can be obtained by uniformly mixing the above-mentioned components, i.e., the binder, the electroconductive powder and optionally the solvent, thixotropic agent, coupling agent, defoaming agent, powder finishing agent, anti-setting agent and the like in one or more of a mixing machine, kneader, triple roll mill, etc., to effect dispersion.

The present invention is explained with the following examples.

EXAMPLE 1

Binder A was prepared by uniformly mixing 82 parts by weight of a bisphenol A-based epoxy resin (Epikote 827, a trade name, mfd. by Japan Epoxy Resin Co., Ltd.), 10 parts by weight of an aliphatic diglycidyl ether (ED-503, a trade name, mfd. by Asahi Denka Kogyo K. K.) and 8 parts by weight of 2-phenyl-4-methyl-imidazole (Curesol, 2 P4MZ, mfd. by Shikoku Chemicals Corp.) in an automated mortar and a triple roll mill.

On the other hand, binder B was prepared by uniformly mixing 40 parts by weight of a phenolic resin (Bell pearl S-890, a trade name, mfd. by Kanebo, Ltd.), 60 parts by weight of a bisphenol A-based epoxy resin (Epikote 827, a trade name, mfd. by Yuka Shell Epoxy Co., Ltd.) and 5 parts by weight of the same 2-phenyl-4-methyl-imidazole as used above, in an automated mortar and a triple roll mill.

The proportions of the epoxy resin and the phenolic resin in binder B were such that the weight ratio of the epoxy resin to the phenolic resin was 60:40.

Next, spherical copper powder with an average particle size of 5.1 $\mu$m (SFR-Cu, a trade name, manufactured by Nippon Atomized Metal Powders Corp. by an atomizing method) was washed with diluted hydrochloric acid and pure water and then subjected to substitutional plating by use of a plating solution containing 80 g of AgCN and 75 g of NaCN per liter of water, so that the proportion of silver might be 18 wt % based on the weight of the spherical copper powder. The thus treated copper powder was washed with water and dried to obtain silver-plated copper powder (silver-coated copper powder)- Five particles of the silver-plated copper powder obtained were subjected to quantitative analysis with a scanning Auger electron spectroscopic analysis apparatus to investigate the exposed area of the copper powder. As a result, it was found that the exposed area ranged from 12 to 28% and averaged 21%.

Then, 750 g of the silver-plated copper powder obtained above and 3 kg of zirconia balls with a diameter of about 3 mm were charged into the 4-liters container of a ball mill, and the container was rotated for 40 minutes to obtain substantially spherical silver-coated copper powder having an aspect ratio on the average of 1.2 and an average particle size (an average length of particles) of 5.4 $\mu$m.

On the other hand, 400 g of the silver-plated copper powder obtained above and 4 kg of zirconia balls with a diameter of 10 mm were charged into the 4-liters container of a ball mill, and the container was vibrated and rotated for 4 hours to obtain flake-like or flaky silver-coated copper powder having an aspect ratio on the average of 7.2 and an average particle size (an average length of particles) of 8.6 $\mu$m.

Electroconductive paste A was obtained by uniformly mixing 40 parts by weight of binder A obtained above, 440 parts by weight of the substantially spherical silver-coated copper powder obtained above, 20 parts by weight of the flake-like or flaky silver-coated copper powder obtained above and 10 parts by weight of 3-methyl-3-methoxybutanol (Solfit, a trade name, mfd. by Kuraray Co. Ltd.) as a solvent in a stirring and mixing machine and a triple roll mill to effect dispersion.

On the other hand, electroconductive paste B was obtained by uniformly mixing 65 parts by weight of binder B obtained above, 220 parts by weight of the flake-like or flaky silver-coated copper powder obtained above, 140 parts by weight of flake-like or flaky silver powder with an average particle size of 2.1 $\mu$m (TCG-1, a trade name, mfd. by Tokuriki Chemical Research Co., Ltd.) and 75 parts by weight of 3-methyl-3-methoxybutanol (Solfit, a trade name, mfd. by Kuraray Co., Ltd.) as a solvent in a stirring and mixing machine and a triple roll mill to effect dispersion.

The proportions of the substantially spherical silver-coated copper powder and the flake-like or flaky silver-coated copper powder in electroconductive paste A were such that the weight ratio of the substantially spherical silver-coated copper powder to the flake-like or flaky silver-coated copper powder was 96:4. The proportions of the flake-like or flaky silver-coated copper powder and the flake-like or flaky silver powder in electroconductive paste B were such that the weight ratio of the flake-like or flaky silver-coated copper powder to the flake-like or flaky silver powder was 61:39. The proportions of the binder and the electroconductive powders as solids in electroconductive paste A were such that the weight ratio of the binder to the electroconductive powders was 8:92. The content of the solvent in electroconductive paste A was 1.96 wt % based on the weight of the electroconductive paste. The proportions of the binder and the electroconductive powders as solids in electroconductive paste B were such that the weight ratio of the binder to the electroconductive powders was 15:85. The content of the solvent in electroconductive paste B was 15 wt % based on the weight of the electroconductive paste.

Next, as shown in FIG. 1, through-holes 10 with a diameter of 0.4 mm were formed in a glass-epoxy copper-clad laminate of 1.0 mm thick (MCL-E-670, a trade name, Hitachi Chemical Company, Ltd.) (hereinafter referred to as substrate 3), and were filled with electroconductive paste A obtained above, to form electroconductive layers 4. Then, the surfaces of the copper foils of substrate 3 were polished, after which the copper foils of substrate 3 were partly removed by etching to form copper foil lands 7, copper foil circuits 8 and 11. Subsequently, insulating layers 5 were formed on the surfaces of the copper foil circuits 8 and 11 and between the copper foil lands 7 and the copper foil circuits 11 by three runs of printing operation by use of an insulating material having both UV-setting property and thermosetting property (SGR-100, a trade name, mfd. by Taiyo Ink Mfg. Co., Ltd.).

Thereafter, jumper circuits 6 were formed on the ends of the through-holes, the surfaces of the copper foil lands 7, and the surfaces of the insulating layers 5 except for unnecessary portions for electroconductivity by using electroconductive paste B obtained above and dried at 80° C. for 0.5 hour and then heat-treated at 165° C. for 1 hour. Overcoat layers 9 were formed on the surfaces of the jumper circuits 6 and parts of the insulating layer 5 by use of the above-mentioned insulating material. The product thus obtained was dried at 80° C. for 1 hour and then heat-treated at 165° C. for 1 hour to obtain a through-hole wiring board.

Initial characteristics of the obtained through-hole wiring board were evaluated. As a result, it was found that the resistance per through-hole in the through-hole wiring board had a maximum of 195 mΩ/hole, a minimum of 163 mΩ/hole and an average of 176 mΩ/hole. A direct-current voltage of 50 V was applied between the copper foil circuits 11 and jumper circuits 6 of the through-hole wiring board in which the jumper circuits 6 were insulated by the insulating layers 5, and the insulation resistance was measured and found to be $10^{11}\Omega$ or more. The sheet resistance of the jumper circuits 6 was found to be 87 $\mu\Omega\cdot$cm.

In addition, the through-hole wiring board was subjected to 1,000 cycles of a thermal shock test to find that the rate of resistance change of the through-holes was 6.7% and that of the jumper circuits 6 was 2.5%.

On the other hand, the through-hole wiring board was subjected to an anti-migration test to find that the insulation resistance was $10^{11}\Omega$ or more. The thermal shock test conditions were such that 1,000 cycles each composed of heating at 125° C. for 30 minutes and cooling at −65° C. for 30 minutes were carried out. In the anti-migration test, a direct-current voltage of 20 V was continuously applied between the copper foil circuits 11 and jumper circuits 6 at 85° C. and 85% RH for 1,000 hours.

A concrete method for measuring the aspect ratio in the present example is described below. After mixing 8 g of the principal agent (No. 10-8130) and 2 g of the curing agent (No. 10-8132) of a low-viscosity epoxy resin (mfd. by Buehler Ltd.), 2 g of each electroconductive powder was mixed therewith and sufficiently dispersed therein. The resulting mixture was subjected to vacuum deaeration at 30° C. as it was, and then allowed to stand at 30° C. for 10 hours to precipitate particles and conduct curing. Then, the resulting cured product was vertically cut and the cut surface was magnified 1,000 times by an electron microscope. For 150 particles which had appeared on the cut surface, the ratio of length to breadth of each particle was calculated, and the average of the thus obtained values was taken as the aspect ratio. The aspect ratio was measured by the same method as above in the following Examples and Comparative Examples.

EXAMPLE 2

Electroconductive paste C was obtained by uniformly mixing 45 parts by weight of binder A obtained in Example 1, 435 parts by weight of the substantially spherical silver-coated copper powder obtained in Example 1, 20 parts by weight of arborescent silver powder (EG-20, a trade name, mfd. by Tokuriki Chemical Research Co., Ltd.) and 10 parts by weight of 3-methyl-3-methoxybutanol (Solfit, a trade name, mfd. by Kuraray Co., Ltd.) as a solvent in a stirring and mixing machine and a triple roll mill to effect dispersion.

Electroconductive paste D was obtained by uniformly mixing 65 parts by weight of binder B obtained in Example 1, 240 parts by weight of the flake-like or flaky silver-coated copper powder obtained in Example 1, 100 parts by weight of flake-like or flaky silver powder with an average particle size of 2.1 $\mu$m (TCG-1, a trade name, mfd. by Tokuriki Chemical Research Co., Ltd.), 20 parts by weight of arborescent silver powder (EG-20, a trade name, mfd. by Tokuriki Chemical Research Co., Ltd.) and 75 parts by weight of 3-methyl-3-methoxybutanol (Solfit, a trade name, mfd. by Kuraray Co., Ltd.) as a solvent in a stirring and mixing machine and a triple roll mill to effect dispersion.

The proportions of the substantially spherical silver-coated copper powder and the silver powder in electroconductive paste C were such that the weight ratio of the substantially spherical silver-coated copper powder to the silver powder was 96:4. The proportions of the flake-like or flaky silver-coated copper powder and the silver powders in electroconductive paste D were such that the weight ratio of the flake-like or flaky silver-coated copper powder to the silver powders was 67:33. The proportions of the binder and the electroconductive powders as solids in electroconductive paste C were such that the weight ratio of the binder to the electroconductive powders was 9:91. The content of the solvent in electroconductive paste C was 1.96 wt % based on the weight of the electroconductive paste. The proportions of the binder and the electroconductive powders as solids in electroconductive paste D were such that the weight ratio of the binder to the electroconductive powders was 15:85. The content of the solvent in electroconductive paste D was 15 wt % based on the weight of the electroconductive paste.

Next, a through-hole wiring board was produced by the same procedure as described in Example 1 and initial characteristics of the through-hole wiring board obtained were evaluated As a result, it was found that the resistance per through-hole had a maximum of 198 mΩ/hole, a minimum of 163 mΩ/hole and an average of 175 mΩ/hole. A direct-current voltage of 50 V was applied between the copper foil circuits and the jumper circuits in the same manner as described in Example 1, and the insulation resistance was measured and found to be $10^{11}\Omega$ or more. The sheet resistance of the jumper circuits was found to be 79 mΩ·cm.

In addition, the through-hole wiring board was subjected to a thermal shock test by the same method as described in Example 1, to find that the rate of resistance change of the through-holes was 5.8% and that of the jumper circuits 1.9%.

On the other hand, the through-hole wiring board was subjected to an anti-migration test by the same method as

EXAMPLE 3

Electroconductive paste E was obtained by uniformly mixing 35 parts by weight of binder A obtained in Example 1, 435 parts by weight of the substantially spherical silver-coated copper powder obtained in Example 1, 30 parts by weight of arborescent silver powder (EG-20, a trade name, mfd. by Tokuriki Chemical Research Co., Ltd.) and 13 parts by weight of the same 3-methyl-3-methoxybutanol as used in Example 2, as a solvent in a stirring and mixing machine and a triple roll mill to effect dispersion.

Electroconductive paste F was obtained by uniformly mixing 60 parts by weight of binder B obtained in Example 1, 295 parts by weight of the flake-like or flaky silver-coated copper powder obtained in Example 1, 50 parts by weight of the same flake-like or flaky silver powder with an average particle size of 2.1 $\mu$m as used in Example 2, 20 parts by weight of the same arborescent silver powder as used in Example 2 and 75 parts by weight of the same 3-methyl-3-methoxybutanol as used in Example 2, as a solvent in a stirring and mixing machine and a triple roll mill to effect dispersion.

The proportions of the substantially spherical silver-coated copper powder and the silver powder in electroconductive paste E were such that the weight ratio of the substantially spherical silver-coated copper powder to the silver powder was 94:6. The proportions of the flake-like or flaky silver-coated copper powder and the silver powders in electroconductive paste F were such that the weight ratio of the flake-like or flaky silver-coated copper powder to the silver powders was 81:19. The proportions of the binder and the electroconductive powders as solids in electroconductive paste E were such that the weight ratio of the binder to the electroconductive powders was 7:93. The content of the solvent in electroconductive paste E was 2.5 wt % based on the weight of the electroconductive paste. The proportions of the binder and the electroconductive powders as solids in electroconductive paste F were such that the weight ratio of the binder to the electroconductive powders was 14:86. The content of the solvent in electroconductive paste F was 15 wt % based on the weight of the electroconductive paste.

Next, a through-hole wiring board was produced by the same procedure as described in Example 1 and initial characteristics of the through-hole wiring board obtained were evaluated. As a result, it was found that the resistance per through-hole had a maximum of 184 m$\Omega$/hole, a minimum of 156 m$\Omega$/hole and an average of 165 m$\Omega$/hole. A direct-current voltage of 50 V was applied between the copper foil circuits and the jumper circuits in the same manner as described in Example 1, and the insulation resistance was measured and found to be $10^{11}\Omega$ or more. The sheet resistance of the jumper circuits was found to be 83 $\mu\Omega$·cm.

In addition, the through-hole wiring board was subjected to a thermal shock test by the same method as described in Example 1, to find that the rate of resistance change of the through-holes was 3.9% and that of the jumper circuits 2.3%.

On the other hand, the through-hole wiring board was subjected to an anti-migration test by the same method as described in Example 1, to find that the insulation resistance was $10^{11}\Omega$ or more.

COMPARATIVE EXAMPLE 1

As shown in FIG. 5, through-holes 10 with a diameter of 0.4 mm were formed in substrate 3 and filled with electroconductive paste A obtained in Example 1, to form electroconductive layers 4. After drying and curing, the surfaces of thus treated substrate were polished to connect the electroconductive material in the through-holes 10 to copper foil lands 7 electroconductively at the ends of the through-holes Then, insulating layers 5 were formed on the surfaces of the substrate, the ends of the through-holes, the surfaces of the copper foil lands 7 and a part of the surfaces of copper foil circuits 8. Printing was conducted on the insulating layers 5 by use of electroconductive paste B obtained in Example 1, to form jumper circuits 6 between the copper foil circuits via the surfaces of the insulating layers. overcoat layers 9 were formed on the jumper circuits 6 by use of the same insulating material as described above. The product thus obtained was dried at 80° C. for 1 hour and then heat-treated at 165° C. for 1 hour to obtain a through-hole wiring board.

In the above process, the insulating layers were formed by three runs of printing operation using an insulating material having both UV-setting property and thermosetting property (SGR-100, a trade name, mfd by Taiyo Ink Seizo K.K.).

Initial characteristics of the through-hole wiring board obtained were evaluated. As a result, it was found that the resistance per through-hole had the following large values: maximum 355 m$\Omega$/hole, minimum 175 m$\Omega$/hole, and average 265 m$\Omega$/hole.

The through-hole wiring board was subjected to 1,000 cycles of a thermal shock test by the same method as described in Example 1, to find that the rate of resistance change of the through-holes was 359% and that of the jumper circuits 6 was 2.4%.

COMPARATIVE EXAMPLE 2

A through-hole wiring board was obtained by the same process as in Example 1 except for using electroconductive paste A obtained in Example 1, as electroconductive paste to fill through-holes and electroconductive paste for forming jumper circuits.

Initial characteristics of the through-hole wiring board obtained were evaluated. As a result, it was found that the resistance per through-hole had a maximum of 213 m$\Omega$/hole, a minimum of 173 m$\Omega$/hole and an average of 182 m$\Omega$/hole. A direct-current voltage of 50 V was applied between the copper foil circuits and the jumper circuits in the same manner as described in Example 1, and the insulation resistance was measured and found to be $10^{12}\Omega$ or more. The sheet resistance of the jumper circuits was found to be as high as 250 m $\Omega$·cm.

In addition, the through-hole wiring board was subjected to 1,000 cycles of a thermal shock test by the same method as described in Example 1, to find that the rate of resistance change of the through-holes was as high as 125% and that of the jumper circuits 6 was as high as 95%.

On the other hand, the through-hole wiring board was subjected to an anti-migration test by the same method as described in Example 1, to find that the insulation resistance was $10^{11}\Omega$ or more.

EXAMPLE 4

A binder was prepared by uniformly mixing 40 parts by weight of a butoxy group-containing resol type phenolic resin (manufactured by way of trial by Hitachi Chemical Company, Ltd.; butoxylation rate 65%, and weight average molecular weight 1, 200), 55 parts by weight of the same bisphenol A-based epoxy resin as used in Example 1 and 5 parts by weight of the same 2-phenyl-4-methyl-imidazole as used in Example 1.

The weight ratio of the phenolic resin to the epoxy resin was 42.1:57.9.

Then, 750 g of the silver-plated copper powder obtained in Example 1 and 3 kg of zirconia balls with a diameter of 5 mm were charged into the 2-liters container of a ball mill, and the container was rotated for 40 minutes to obtain substantially spherical silver-coated copper powder having an aspect ratio on the average of 1.3 and an average particle size (an average length of particles) of 5.5 μm. Five particles of the silver-plated copper powder obtained were subjected to quantitative analysis with a scanning Auger electron spectroscopic analysis apparatus to investigate the exposed area of the copper powder. As a result, it was found that the exposed area ranged from 10 to 50% and averaged 20%.

An electroconductive paste was obtained by uniformly mixing 50 g of the binder obtained above, 450 g of the substantially spherical silver-coated copper powder obtained above and 15 g of ethyl carbitol as a solvent in a stirring and mixing machine and a triple roll mill to effect dispersion.

The viscosity of the obtained electroconductive paste was 720 dPa·s. For measuring the viscosity, a viscometer HBT manufactured by Brookfield Engineering Laboratories, Inc. was used. The same viscometer HBT as above was used in the following Examples.

The proportions of the binder and the electroconductive powder as solids in the electroconductive paste were such that the weight ratio of the binder to the electroconductive powder was 10:90.

Figure 8:
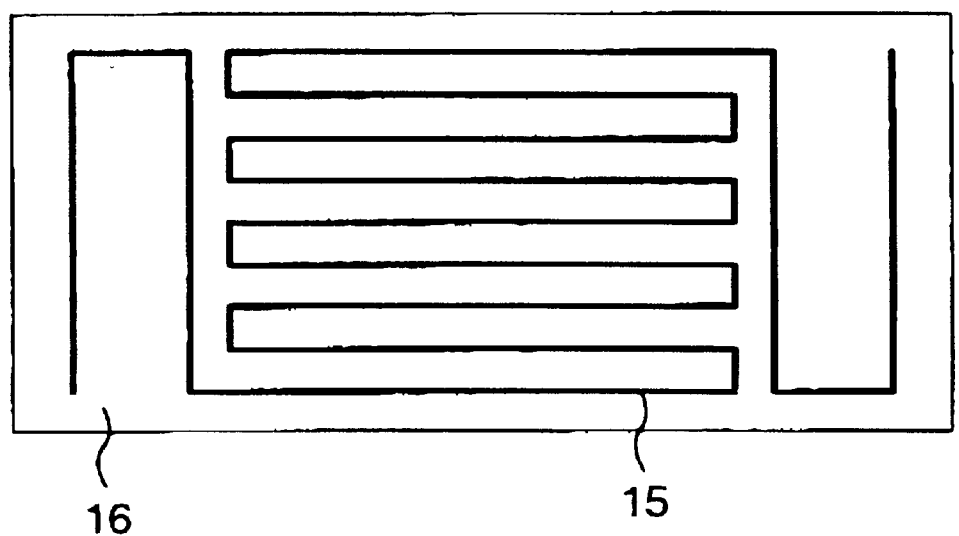
FIG. 8 is plan view showing a state in which a test pattern is formed on a polyethyleneterephathalate film.

Next, the test pattern 15 shown in FIG. 8 was printed on a poly(ethylene terephthalate) film preshrunk at 170° C., by using the electroconductive paste obtained above. The thus treated film was pre-dried at 90° C. for 20 minutes in the air and then heat-treated at 170° C. for 1 hour to obtain a wiring board.

Characteristics of the obtained wiring board were evaluated to find that the specific resistance of conductor was 1.4 μΩ·m. In FIG. 8, numeral 16 denotes the poly(ethylene terephthalate) film.

Figure 9:
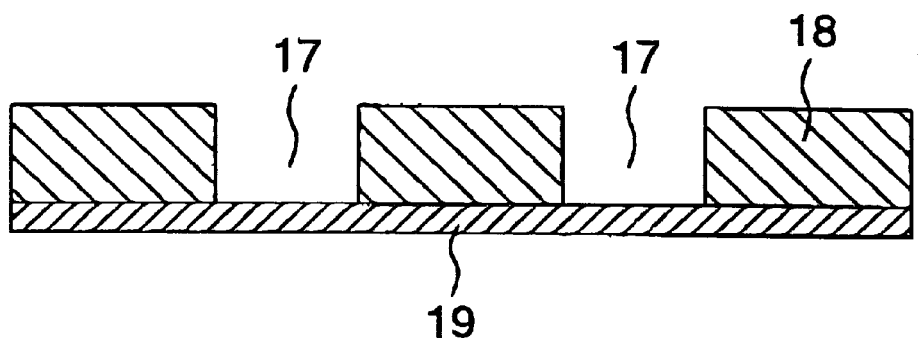
FIG. 9 is a cross-sectional view showing non-through-holes formed in a copper foil-attached adhesive film.

On the other hand, as shown in FIG. 9, bottomed-through-holes 17 with diameters of 0.15 mm and 0.1 mm, respectively, were formed in a copper foil-attached adhesive film of 55 μm thick having a copper foil of 55 μm thick firmly attached (MCF-3000E, a trade name, mfd. by Hitachi Chemical Company, Ltd.) by using a laser. The bottomed-through-holes 17 were filled with the electroconductive pasted obtained above. Then, sections of the bottomed-through-holes 17 were observed to confirm that the electroconductive paste filling the bottomed-through-holes 17 with diameters of 0.15 mm and 0.1 mm, respectively, had no void, namely, the bottomed-through-holes 17 had been completely filled with the electroconductive paste. In FIG. 9, numeral 18 denotes the copper foil-attached adhesive film, and numeral 19 the copper foil.

EXAMPLE 5

A binder was prepared by uniformly mixing 65 parts by weight of a methoxy group-containing resol type phenolic resin (manufactured by way of trial by Hitachi Chemical Company, Ltd.; methoxylation rate 80%, and weight average molecular weight 1,100), 30 parts by weight of the same bisphenol A-based epoxy resin as used in Example 1 and 5 parts by weight of the same 2-phenyl-4-methyl-imidazole as used in Example 1.

The weight ratio of the phenolic resin to the epoxy resin was 72.2:27.8.

An electroconductive paste was obtained by uniformly mixing 40 g of the binder obtained above, 460 g of the substantially spherical silver-coated copper powder obtained in Example 4 and 15 g of ethyl carbitol as a solvent in a stirring and mixing machine and a triple roll mill to effect dispersion.

The viscosity of the obtained electroconductive paste was measured by the same method as described in Example 4, and found to be 750 dpa·s.

The proportions of the binder and the electroconductive powder as solids in the electroconductive paste were such that the weight ratio of the binder to the electroconductive powder was 8:92.

Next, the same wiring board as in Example 4 was produced by the same process as described in Example 4 and its characteristics were evaluated to find that the specific resistance of conductor was 1.6 μΩm. Sections of the non-through-holes of the wiring board which had been filled with the electroconductive paste were observed to confirm that the electroconductive paste filling the non-through-holes with diameters of 0.15 mm and 0.1 mm, respectively, had no void, namely, the non-through-holes had been completely filled with the electroconductive paste.

EXAMPLE 6

A binder was prepared by uniformly mixing 40 parts by weight of a phenolic resin (Bell pearl S-895, a trade name, mfd. by Kanebo, Ltd.), 55 parts by weight of the same bisphenol A-based epoxy resin as used in Example 1 and 5 parts by weight of the same 2-phenyl-4-methyl-imidazole as used in Example 1.

The weight ratio of the phenolic resin to the epoxy resin was 42.1:57.9.

An electroconductive paste was obtained by uniformly mixing 50 g of the binder obtained above, 450 g of the substantially spherical silver-coated copper powder obtained in Example 4 and 15 g of ethyl carbitol as a solvent in a stirring and mixing machine and a triple roll mill to effect dispersion.

The viscosity of the obtained electroconductive paste was measured by the same method as described in Example 4, and found to be 3170 dPa·s.

The proportions of the binder and the electroconductive powder as solids in the electroconductive paste were such that the weight ratio of the binder to the electroconductive powder was 10:90.

Next, the same wiring board as in Example 4 was produced by the same process as described in Example 4, and its characteristics were evaluated to find that the specific resistance of conductor was 2.2 μΩ·m which was not very different from the value obtained in Example 4. However, sections of the non-through-holes of the wiring board which had been filled with the electroconductive paste were observed to find that there were spaces between the electroconductive paste and the wall surfaces of each of the non-through-holes with diameters of 0.15 mm and 0.1 mm, respectively, and that the electroconductive paste had voids.

EXAMPLE 7

A binder was prepared by uniformly mixing 40 parts by weight of a phenolic resin (Resitop PGA-4528, a trade name, mfd. by Gun-ei Chemical Industry Co., Ltd.), 55 parts by weight of the same bisphenol A-based epoxy resin as used in Example 1 and 5 parts by weight of the same 2-phenyl-4-methyl-imidazole as used in Example 1.

The weight ratio of the phenolic resin to the epoxy resin was 42.1:57.9.

An electroconductive paste was obtained by uniformly mixing 50 g of the binder obtained above, 450 g of the substantially spherical silver-coated copper powder obtained in Example 4 and 15 g of ethyl carbitol as a solvent in a stirring and mixing machine and a triple roll mill to effect dispersion.

The viscosity of the obtained electroconductive paste was measured by the same method as described in Example 4, and found to be 3160 dPa·s. The proportions of the binder and the electroconductive powder as solids in the electroconductive paste were such that the weight ratio of the binder to the electroconductive powder was 10:90.

Next, the same wiring board as in Example 4 was produced by the same process as described in Example 4, and its characteristics were evaluated to find that the specific resistance of conductor was 1.9 $\mu\Omega$·m which was not very different from the value obtained in Example 4. However, sections of the non-through-holes of the wiring board which had been filled with the electroconductive paste were observed to find that there were spaces between the electroconductive paste and the wall surfaces of each of the non-through-holes with diameters of 0.15 mm and 0.1 mm, respectively, and that the electroconductive paste had voids.

EXAMPLE 8

A binder was prepared by uniformly mixing 10 parts by weight of the same phenolic resin as used in Example 6, 85 parts by weight of the same bisphenol A-based epoxy resin as used in Example 1 and 5 parts by weight of the same 2-phenyl-4-methyl-imidazole as used in Example 1.

The weight ratio of the phenolic resin to the epoxy resin was 10.5:85.9.

An electroconductive paste was obtained by uniformly mixing 50 g of the binder obtained above, 450 g of the substantially spherical silver-coated copper powder obtained in Example 4 and 15 g of ethyl carbitol as a solvent in a stirring and mixing machine and a triple roll mill to effect dispersion.

The viscosity of the obtained electroconductive paste was measured by the same method as described in Example 4, and found to be 1260 dPa·s.

The proportions of the binder and the electroconductive powder as solids in the electroconductive paste were such that the weight ratio of the binder to the electroconductive powder was 10.90.

Next, the same wiring board as in Example 4 was produced by the same process as described in Example 4, and its characteristics were evaluated to find that the specific resistance of conductor was as high as 11.5 $\mu\Omega$·m which was rather higher than the value obtained in Example 4. Sections of the non-through-holes of the wiring board which had been filled with the electroconductive paste were observed to confirm that the electroconductive paste filling the non-through-holes with diameters of 0.15 mm and 0.1 mm, respectively, had no void, namely, the non-through-holes had been completely filled with the electroconductive paste.

EXAMPLE 9

A binder was prepared by uniformly mixing 45 parts by weight of the same butoxy group-containing resol type phenolic resin as used in Example 4, 50 parts by weight of the same bisphenol A-based epoxy resin as used in Example 1 and 5 parts by weight of the same 2-phenyl-4-methyl-imidazole as used in Example 1.

The weight ratio of the phenolic resin to the epoxy resin was 47.4:52.6.

An electroconductive paste was obtained by uniformly mixing 50 g of the binder obtained above, 450 g of the substantially spherical silver-coated copper powder obtained in Example 4 and 15 g of ethyl carbitol as a solvent in a stirring and mixing machine and a triple roll mill to effect dispersion.

The obtained electroconductive paste had a specific gravity of 5.2 and a viscosity of 750 dPa·s.

The proportions of the binder and the electroconductive powder as solids in the electroconductive paste were such that the volume ratio of the binder to the electroconductive powder was 46.1:53.9 and the weight ratio of the binder to the electroconductive powder was 10:90.

Next, the same wiring board as in Example 4 was produced by the same process as described in Example 4, and its characteristics were evaluated to find that the specific resistance of conductor was 1.3 $\mu\Omega$·m. Sections of the non-through-holes of the wiring board which had been filled with the electroconductive paste were observed to confirm that the electroconductive paste filling the non-through-holes with diameters of 0.15 mm and 0.1 mm, respectively, had no void, namely, the non-through holes had been completely filled with the electroconductive paste.

EXAMPLE 10

A binder was prepared by uniformly mixing 60 parts by weight of the same methoxy group-containing resol type phenolic resin as used in Example 5, 35 parts by weight of the same bisphenol A-based epoxy resin as used in Example 1 and 5 parts by weight of the same 2-phenyl-4-methyl-imidazole as used in Example 1.

The weight ratio of the phenolic resin to the epoxy resin was 63.2:36.8.

An electroconductive paste was obtained by uniformly mixing 40 g of the binder obtained above, 460 g of the substantially spherical silver-coated copper powder obtained in Example 4 and 15 g of ethyl carbitol as a solvent in a stirring and mixing machine and a triple roll mill to effect dispersion.

The obtained electroconductive paste had a specific gravity of 5.3 and a viscosity of 780 dpa·s.

The proportions of the binder and the electroconductive powder as solids in the electroconductive paste were such that the volume ratio of the binder to the electroconductive powder was 40.1:59.9 and the weight ratio of the binder to the electroconductive powder was 8:92.

Next, the same wiring board as in Example 4 was produced by the same process as described in Example 4, and its characteristics were evaluated to find that the specific resistance of conductor was 1.2 $\mu\Omega$·m. Sections of the non-through-holes of the wiring board which had been filled with the electroconductive paste were observed to confirm that the electroconductive paste filling the non-through-holes with diameters of 0.15 mm and 0.1 mm, respectively, had no void, namely, the non-through-holes had been completely filled with the electroconductive paste.

EXAMPLE 11

An electroconductive paste was obtained by uniformly mixing 15 g of the binder obtained in Example 9, 485 g of the substantially spherical silver-coated copper powder obtained in Example 4 and 15 g of ethyl carbitol as a solvent in a stirring and mixing machine and a triple roll mill to effect dispersion.

The obtained electroconductive paste had a specific gravity of 7.8 and a viscosity of 5110 dPa·s The proportions of the binder and the electroconductive powder as solids in the electroconductive paste were such that the volume ratio of the binder to the electroconductive powder was 19.2:80.8 and the weight ratio of the binder to the electroconductive powder was 3:97.

Next, the same wiring board as in Example 4 was produced by the same process as described in Example 4 and its characteristics were evaluated, but no proper conductor could be obtained because of the high viscosity, so that no measurement could be carried out. Sections of the non-through-holes of the wiring board which had been filled with the electroconductive paste were observed to find that there were spaces between the electroconductive paste and the wall surfaces of each of the non-through-holes with diameters of 0.15 mm and 0.1 mm, respectively, and that the electroconductive paste had voids.

EXAMPLE 12

An electroconductive paste was obtained by uniformly mixing 100 g of the binder obtained in Example 9, 400 g of the substantially spherical silver-coated copper powder obtained in Example 4 and 15 g of ethyl carbitol as a solvent in a stirring and mixing machine and a triple roll mill to effect dispersion.

The obtained electroconductive paste had a specific gravity of 2.8 and a viscosity of 390 dPa·s.

The proportions of the binder and the electroconductive powder as solids in the electroconductive paste were such that the volume ratio of the binder to the electroconductive powder was 65.8:34.1 and the weight ratio of the binder to the electroconductive powder was 20:80.

Next, the same wiring board as in Example 4 was produced by the same process as described in Example 4, and its characteristics were evaluated to find that the specific resistance of conductor was as high as 10.9 $\mu\Omega$·m which was rather higher than the value obtained in Example 4. Sections of the non-through-holes of the wiring board which had been filled with the electroconductive paste were observed to confirm that the electroconductive paste filling the non-through-holes with diameters of 0.15 mm and 0.1 mm, respectively, had no void, namely, the non-through-holes had been completely filled with the electroconductive paste.

EXAMPLE 13

A binder was prepared by uniformly mixing 60 parts by weight of an epoxy resin (140C, a trade name, mfd. by Mitsui Chemicals, Inc.; epoxy equivalent 195 to 215 g/eq), 40 parts by weight of the same aliphatic diglycidyl ether as used in Example 1, 3 parts by weight of the same 2-phenyl-4-methyl-imidazole as used in Example 1 and 3 parts by weight of dicyandiamide.

Then, 750 g of the silver-plated copper powder obtained in Example 1 and 3 kg of zirconia balls with a diameter of 5 mm were charged into the 2-liters container of a ball mill, and the container was rotated for 40 minutes to obtain substantially spherical silver-coated copper powder having a specific surface area of 0.16 m$^2$/g, an aspect ratio on the average of 1.3 and an average particle size (an average length of particles) of 5.5 $\mu$m. Five particles of the silver-plated copper powder obtained were subjected to quantitative analysis with a scanning Auger electron spectroscopic analysis apparatus to investigate the exposed area of the copper powder. As a result, it was found that the exposed area ranged from 10 to 50% and averaged 20%.

An electroconductive paste was obtained by uniformly mixing 50 g of the binder obtained above, 465 g of the substantially spherical silver-coated copper powder obtained above and 11 g of ethyl carbitol as a solvent in a stirring and mixing machine and a triple roll mill to effect dispersion.

The obtained electroconductive paste was heat-treated at 170° C. for 90 minutes to obtain a cured product of the electroconductive paste. Tg of the electroconductive paste cured product was measured at a load of 3 g and a heating rate of 5° C./min by use of TMA120 manufactured by Seiko Instruments Inc., and was found to be 68° C.

The proportions of the binder and the electroconductive powder as solids in the electroconductive paste were such that the volume ratio of the binder to the electroconductive powder was 37:63 and the weight ratio of the binder to the electroconductive powder was 7:93. The weight ratio of the epoxy resin to the flexibilizer was 60:40.

Figure 10:
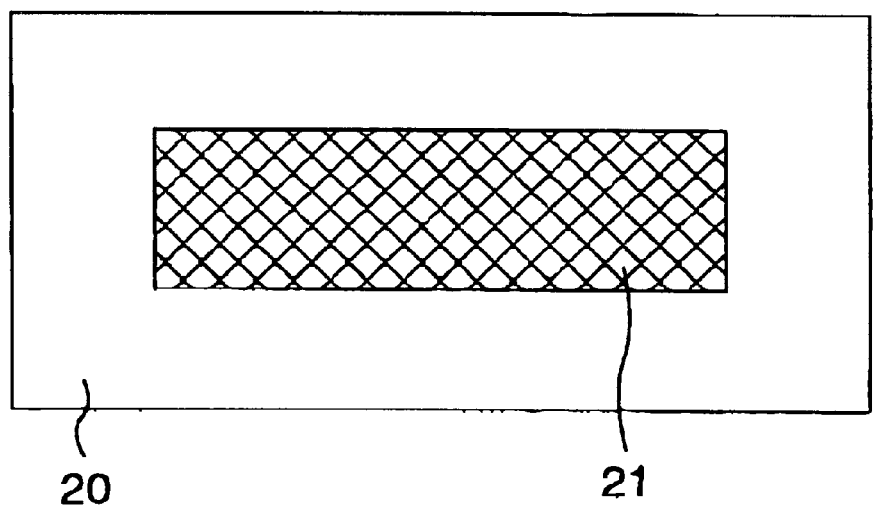
FIG. 10 is a plan view of a conductor formed on a paper-phenol copper-clad laminate.

As shown in FIG. 10, the electroconductive paste obtained above was applied on one side of a paper-phenol copper-clad laminate of 1.0 mm thick (MCL437F, a trade name, mfd. by Hitachi Chemical Company, Ltd.) from which a part of the copper foil had been removed by etching, and was heat-treated at 170° C. for 90 minutes to obtain an electric conductor 21. In FIG. 10, numeral 20 denotes the paper-phenol copper-clad laminate The surface of the obtained electric conductor 21 was polished with wet abrasive paper #3000 to be smoothened and planished, and solder flux was applied on the smoothened and mirror surface, followed by immersion in a bath of molten solder. The thus treated laminate was taken out of the bath and cooled by standing at room temperature. Then, the soldered portion on the surface of the electric conductor 21 was subjected to a tape test (a test in which an adhesive test was attached and then peeled off). As a result, it could be confirmed that no solder had adhered to the tape, namely, soldering had been achieved on the surface of the electric conductor 21.

EXAMPLE 14

A binder was prepared by uniformly mixing 50 parts by weight of the same epoxy resin as used in Example 13, 50 parts by weight of the same aliphatic diglycidyl ether as used in Example 1, 2 parts by weight of the same 2-phenyl-4-methyl-imidazole as used in Example 1 and 3 parts by weight of the same dicyandiamide as used in example 13.

An electroconductive paste was obtained by uniformly mixing 25 g of the binder obtained above, 475 g of the substantially spherical silver-coated copper powder obtained in Example 13 and 11 g of ethyl carbitol as a solvent in a stirring and mixing machine and a triple roll mill to effect dispersion.

The obtained electroconductive paste was heat-treated at 170° C. for 90 minutes to obtain a cured product of the electroconductive paste. Tg of the electroconductive paste cured product was measured by the same method as described in Example 13, and found to be 59° C.

The proportions of the binder and the electroconductive powder as solids in the electroconductive paste were such that the volume ratio of the binder to the electroconductive powder was 29:71 and the weight ratio of the binder to the electroconductive powder was 5:95. The weight ratio of the epoxy resin to the flexibilizer was 50:50.

Next, an electric conductor was produced by the same process as described in Example 13 and subjected to the same tape test as described in Example 13, to confirm that no solder had adhered to the tape, namely, soldering had been achieved on the surface of the electric conductor.

EXAMPLE 15

In a stirring and mixing machine and a triple roll mill, 15 g of the binder obtained in Example 13, 485 g of the substantially spherical silver-coated copper powder obtained in Example 13 and 11 g of ethyl carbitol as a solvent were uniformly mixed to effect dispersion. The resulting electroconductive paste had such a high viscosity that its application was difficult. Therefore, the production of an electric conductor and the tape test thereon were not carried out.

The proportions of the binder and the electroconductive powder as solids in the electroconductive paste were such that the volume ratio of the binder to the electroconductive powder was 19:61 and the weight ratio of the binder to the electroconductive powder was 3:97. The weight ratio of the epoxy resin to the flexibilizer was 60:40.

EXAMPLE 16

In a stirring and mixing machine and a triple roll mill, 75 g of the binder obtained in Example 13, 425 g of the substantially spherical silver-coated copper powder obtained in Example 13 and 11 g of ethyl carbitol as a solvent were uniformly mixed to effect dispersion. The resulting electroconductive paste had such a high viscosity that its application was difficult. Therefore, the production of an electric conductor and the tape test thereon were not carried out.

The obtained electroconductive paste was heat-treated at 170° C. for 90 minutes to obtain a cured product of the electroconductive paste. Tg of the electroconductive paste cured product was measured by the same method as described in Example 13, and found to be 68° C.

The proportions of the binder and the electroconductive powder as solids in the electroconductive paste were such that the volume ratio of the binder to the electroconductive powder was 58:42 and the weight ratio of the binder to the electroconductive powder was 15:85. The weight ratio of the epoxy resin to the flexibilizer was 60:40.

Next, an electric conductor was produced by the same process as described in Example 13 and subjected to the same tape test as described in Example 13. As a result, solder adhered to the tape, namely, soldering could not be achieved on the surface of the electric conductor.

EXAMPLE 17

A binder was prepared by uniformly mixing 100 parts by weight of the same epoxy resin as used in Example 13, 16 parts by weight of the same phenolic resin as used in Example 6, 6 parts by weight of the same 2-phenyl-4-methyl-imidazole as used in Example 1 and 4 parts by weight of the same dicyandiamide as used in Example 13.

An electroconductive paste was obtained by uniformly mixing 35 g of the binder obtained above, 465 g of the substantially spherical silver-coated copper powder obtained in Example 13 and 11 g of ethyl carbitol as a solvent in a stirring and mixing machine and a triple roll mill to effect dispersion.

The obtained electroconductive paste was heat-treated at 170° C. for 90 minutes to obtain a cured product of the electroconductive paste. Tg of the electroconductive paste cured product was measured by the same method as described in Example 13, and found to be 186° C.

The proportions of the binder and the electroconductive powder as solids in the electroconductive paste were such that the volume ratio of the binder to the electroconductive powder was 38:62 and the weight ratio of the binder to the electroconductive powder was 7:93. The weight ratio of the epoxy resin to the flexibilizer was 100:0.

Next, an electric conductor was produced by the same process as described in Example 13 and subjected to the same tape test as described in Example 13. As a result, solder adhered to the tape, namely, soldering could not be achieved on the surface of the electric conductor.

EXAMPLE 18

A binder was prepared by uniformly mixing 35 parts by weight of the same epoxy resin as used in Example 13, 65 parts by weight of the same aliphatic diglycidyl ether as used in Example 1, 2 parts by weight of the same 2-phenyl-4-methyl-imidazole as used in Example 1 and 2 parts by weight of the same dicyandiamide as used in Example 13.

An electroconductive paste was obtained by uniformly mixing 35 g of the binder obtained above, 465 g of the substantially spherical silver-coated copper powder obtained in Example 13 and 11 g of ethyl carbitol as a solvent in a stirring and mixing machine and a triple roll mill to effect dispersion.

The obtained electroconductive paste was heat-treated at 170° C. for 90 minutes to obtain a cured product of the electroconductive paste. Tg of the electroconductive paste cured product was measured by the same method as described in Example 13, and found to be 37° C.

The proportions of the binder and the electroconductive powder as solids in the electroconductive paste were such that the volume ratio of the binder to the electroconductive powder was 39:61 and the weight ratio of the binder to the electroconductive powder was 7:93. The weight ratio of the epoxy resin to the flexibilizer was 35:65.

Next, an electric conductor was produced by the same process as described in Example 13 and its surface was polished with wet abrasive paper #3000. The surface was damaged during its smoothening and planishing because of the low hardness of the electroconductive paste cured product, so that the electric conductor could not be subjected to the tape test.

EXAMPLE 19

Spherical copper powder with an average particle size of 5.4 μm (SF-Cu, a trade name, manufactured by Nippon Atomized Metal Powders Corp. by an atomizing method) was washed with diluted hydrochloric acid and pure water and then subjected to substitutional plating by use of a plating solution containing 80 g of AgCN and 75 g of NaCN per liter of water, so that the proportion of copper might be 18 wt % based on the weight of the spherical copper powder. The thus treated copper powder was washed with water and dried to obtain silver-plated copper powder.

Then, 470 g of the silver-plated copper powder obtained above and 4 kg of zirconia balls with a diameter of 10 mm were charged into the 2-liters container of a ball mill, and the container was vibrated and rotated for 8 hours. Thus, the shape of the silver-plated copper powder was changed to obtain flake-like or flaky silver-coated copper powder having an aspect ratio on the average of 6.2 and an average particle size (an average length of particles) of 7.8 μm. Ten particles of the flake-like or flaky silver-coated copper powder obtained were subjected to quantitative analysis with a scanning Auger electron spectroscopic analysis apparatus to investigate the exposed area of the copper powder.

As a result, it was found that the exposed area ranged from 23 to 58% and averaged 48%.

An electroconductive paste was obtained by uniformly mixing 35 g of the binder obtained in Example 13, 465 g of the flake-like or flaky silver-coated copper powder obtained above and 40 g of ethyl carbitol (boiling point: 202° C.) as a solvent in a stirring and mixing machine and a triple roll mill to effect dispersion.

The proportions of the binder and the electroconductive powder as solids in the electroconductive paste were such that the weight ratio of the binder to the electroconductive powder was 7:93. The content of the solvent was 7.4 wt %.

Subsequently, the electroconductive paste obtained above was applied on one side of a paper-phenol copper-clad laminate of 1.0 mm thick (MCL-437F, a trade name, mfd. by Hitachi Chemical Company, Ltd.) from which a part of the copper foil had been removed by etching, in the forms shown in FIG. 10 and FIG. 11, and was heat-treated at 170° C. for 90 minutes to obtain an electric conductor 21 and a test pattern 22.

Next, the electric conductor 21 was subjected to the same tape test as described in Example 13, to confirm that no solder had adhered to the tape, namely, soldering had been achieved on the surface of the electric conductor 21.

Figure 11:
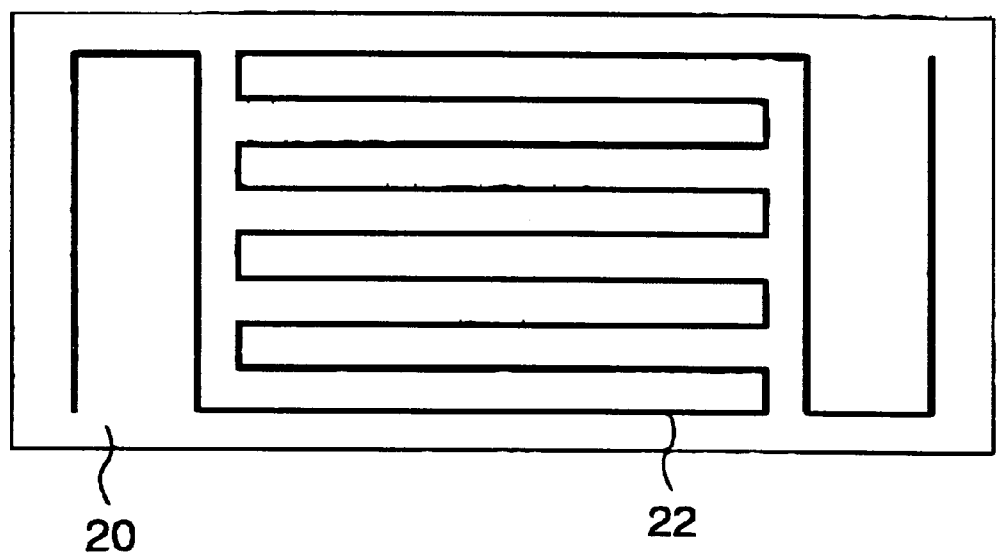
FIG. 11 is a plan view of a test pattern formed on a paper-phenol copper-clad laminate.

The specific resistance of the test pattern shown in FIG. 11 was estimated and found to be 6.1 $\mu\Omega\cdot$m.

EXAMPLE 20

Into the 2-liters container of a ball mill were charged 470 g of the silver-plated copper powder obtained in Example 19 and 3 kg of zirconia balls with a diameter of 10 mm, and the container was vibrated and rotated for 8 hours. Thus, the shape of the silver-plated copper powder was changed to obtain flake-like or flaky silver-coated copper powder having an aspect ratio on the average of 5.7 and an average particle size (an average length of particles) of 7.2 $\mu$m. Ten particles of the flake-like or flaky silver-coated copper powder obtained were subjected to quantitative analysis with a scanning Auger electron spectroscopic analysis apparatus to investigate the exposed area of the copper powder. As a result, it was found that the exposed area ranged from 18 to 52% and averaged 40%.

An electroconductive paste was obtained by uniformly mixing 30 g of the binder obtained in Example 13, 470 g of the flake-like or flaky silver-coated copper powder obtained above and 45 g of ethyl carbitol as a solvent in a stirring and mixing machine and a triple roll mill to effect dispersion.

The proportions of the binder and the electroconductive powder as solids in the electroconductive paste were such that the weight ratio of the binder to the electroconductive powder was 6:94. The content of the solvent was 8.3 wt %.

Next, an electric conductor was produced by the same process as described in Example 13 and subjected to the same tape test as described in Example 13, to confirm that no solder had adhered to the tape, namely, soldering had been achieved on the surface of the electric conductor.

The specific resistance of a test pattern was estimated and found to be 5.8 $\mu\Omega\cdot$m.

EXAMPLE 21

An electroconductive paste was obtained by uniformly mixing 35 g of the binder obtained in Example 13, 465 g of the substantially spherical silver-coated copper powder obtained in Example 1 and 11 g of ethyl carbitol as a solvent in a stirring and mixing machine and a triple roll mill to effect dispersion.

The proportions of the binder and the electroconductive powder as solids in the electroconductive paste were such that the weight ratio of the binder to the electroconductive powder was 7:93. The content of the solvent was 2.2 wt %.

Next, an electric conductor was produced by the same process as described in Example 13 and subjected to the same tape test as described in Example 13, to confirm that no solder had adhered to the tape, namely, soldering had been achieved on the surface of the electric conductor. However, the specific resistance of a test pattern was as high as 16.4 $\mu\Omega\cdot$m.

EXAMPLE 22

Into the 2-liters container of a ball mill were charged 470 g of the silver-plated copper powder obtained in Example 19 and 4 kg of zirconia balls with a diameter of 10 mm, and the container was rotated for a long period of time of 10 hours. As a result, only a small portion of the electroconductive powder was flattened to flake and a large portion thereof was substantially spherical silver-coated copper powder even after the above treatment. Thus, a sufficient amount of flake-like or flaky silver-coated copper powder could not be obtained. Therefore, no operation was carried out after the above step.

EXAMPLE 23

Into the 2-liters container of a ball mill were charged 750 g of the silver-plated copper powder obtained in Example 1 and 3 kg of zirconia balls with a diameter of 5 mm, and the container was rotated for 40 minutes to obtain substantially spherical silver-coated copper powder having a tap density (measured after 1,000 runs of tapping operation) of 5.93 g/cm$^3$, a relative density of 64.5%, an aspect ratio on the average of 1.3 and an average particle size (an average length of particles) of 5.5 $\mu$m. Five particles of the substantially spherical silver-coated copper powder obtained were subjected to quantitative analysis with a scanning Auger electron spectroscopic analysis apparatus to investigate the exposed area of the copper powder. As a result, it was found that the exposed area ranged from 10 to 50% and averaged 20%.

An electroconductive paste was obtained by uniformly mixing 35 g of the binder obtained in Example 13, 465 g of the substantially spherical silver-coated copper powder obtained above and 11 g of ethyl carbitol as a solvent in a stirring and mixing machine and a triple roll mill to effect dispersion.

The proportions of the binder and the electroconductive powder as solids in the electroconductive paste were such that the weight ratio of the binder to the electroconductive powder was 7:93.

Next, an electric conductor was produced by the same process as described in Example 13 and subjected to the same tape test as described in Example 13, to confirm that no solder had adhered to the tape, namely, soldering had been achieved on the surface of the electric conductor.

EXAMPLE 24

Into the 2-liters container of a ball mill were charged 750 g of the silver-plated copper powder obtained in Example 1 and 3 kg of zirconia balls with a diameter of 5 mm, and the container was rotated for 50 minutes to obtain substantially spherical silver-coated copper powder having a tap density (measured after 1,000 runs of tapping operation) of 5.22 g/cm$^3$, a relative density of 58.2%, an aspect ratio on the average of 1.4 and an average particle size (an average length of particles) of 5.6 µm. Five particles of the substantially spherical silver-coated copper powder obtained were subjected to quantitative analysis with a scanning Auger electron spectroscopic analysis apparatus to investigate the exposed area of the copper powder. As a result, it was found that the exposed area ranged from 10 to 50% and averaged 27%.

An electroconductive paste was obtained by uniformly mixing 45 g of the binder obtained in Example. 13, 455 g of the substantially spherical silver-coated copper powder obtained above and 11 g of ethyl carbitol as a solvent in a stirring and mixing machine and a triple roll mill to effect dispersion.

The proportions of the binder and the electroconductive powder as solids in the electroconductive paste were such that the weight ratio of the binder to the electroconductive powder was 9:91.

Next, an electric conductor was produced by the same process as described in Example 13 and subjected to the same tape test as described in Example 13, to confirm that no solder had adhered to the tape, namely, soldering had been achieved on the surface of the electric conductor.

EXAMPLE 25

Into the 2-liters container of a ball mill were charged 750 g of the silver-plated copper powder obtained in Example 1 and 3 kg of zirconia balls with a diameter of 10 mm, and the container was vibrated and rotated for 8 hours to obtain flake-like or flaky silver-coated copper powder having a tap density (measured after 1,000 runs of tapping operation) of 3.79 g/cm$^3$, a relative density of 48%, an aspect ratio on the average of 5.2 and an average particle size (an average length of particles) of 7.7 µm. Five particles of the flake-like or flaky silver-coated copper powder obtained were subjected to quantitative analysis with a scanning Auger electron spectroscopic analysis apparatus to investigate the exposed area of the copper powder. As a result, it was found that the exposed area ranged from 10 to 60% and averaged 45%.

An electroconductive paste was obtained by uniformly mixing 65 g of the binder obtained in Example 13, 435 g of the flake-like or flaky silver-coated copper powder obtained above and 15 g of ethyl carbitol as a solvent in a stirring and mixing machine and a triple roll mill to effect dispersion.

The proportions of the binder and the electroconductive powder as solids in the electroconductive paste were such that the weight ratio of the binder to the electroconductive powder was 13:87.

Next, an electric conductor was produced by the same process as described in Example 13 and subjected to the same tape test as described in Example 13. As a result, solder adhered to the tape, namely, soldering could not be achieved on the surface of the electric conductor.

EXAMPLE 26

An attempt was made to obtain substantially spherical silver-coated copper powder by charging 750 g of the silver-plated copper powder obtained in Example 1 and 2 kg of zirconia balls with a diameter of 1 mm into the 2-liters container of a ball mill, and rotating the container for 20 minutes. However, no electroconductive powder having a high electroconductivity could be obtained because the silver-plated copper powder could not be disagglomerated, resulting in low filling properties. Therefore, no operation was carried out after the above step.

The through-hole wiring board described as the embodiment (1) of the invention is industrially very suitable because it permits easy formation of an electrical connection of the through-holes, has a high reliability on connection, has a small thickness of the electroconductive material formed on the copper foil lands.

The through-hole wiring board described as the embodiment (2) has an especially high reliability on connection in accordance with the aspect of the invention described as the embodiment (1).

The through-hole wiring board described as the embodiment (3) has advantages in that the filling properties of the electroconductive material into the through-holes and the resistance to migration of the printed circuits formed on the insulating layers are good, in addition to the advantages of the aspect of the invention described as the embodiment (1).

The through-hole wiring boards described as the embodiments (4), (5) and (6) have advantages in that the filling properties of the electroconductive paste into through-holes or non-through-holes and its electroconductivity are excellent, in addition to the advantages of the aspect of the invention described as the embodiment (1).

The through-hole wiring boards described as the embodiments (7) to (15) have advantages in that the filling properties of the electroconductive paste into through-holes or non-through-holes and its electroconductivity-improving effect are excellent, In addition to the advantages of the aspect of the invention described as the embodiment (1).

The through-hole wiring board described as the embodiment (16) has an advantage in that it has an excellent solderability, in addition to the advantages of the aspect of the invention described as the embodiment (1).

The through-hole wiring boards described as the embodiments (17) to (20) have an advantage in that they have an excellent solderability-improving effect, in addition to the advantages of the aspect of the invention described as the embodiment (1).

The through-hole wiring board described as the embodiment (21) has advantages in that it has excellent solderability and electroconductivity, in addition to the advantages of the aspect of the invention described as the embodiment (1).

The through-hole wiring board described as the embodiment (22) has advantages in that it is excellent in solderability-improving effect and resistance to migration, in addition to the advantages of the aspect of the invention described as the embodiment (1).

The through-hole wiring boards described as the embodiments (23) to (24) have advantages in that they have the effects and resistance to migration described in the embodiments (21) and (22) and an excellent work-efficiency, in addition to the advantages of the aspect of the invention described as the embodiment (1).

The through-hole wiring board described as the embodiment (25) has an advantage in that it has an excellent solderability, in addition to the advantages of the aspect of the invention described as the embodiment (1).

The through-hole wiring boards described as the embodiments (26) to (28) have an advantage in that they have an excellent solderability-improving effect, in addition to the advantages of the aspect of the invention described as the embodiment (1).

The through-hole wiring board described as the embodiment (29) has the following advantages; solder wettability for the copper foil lands on the side on which chip components are to be soldered is good, connecting properties to these copper foil lands are excellent, and the reliability on connection to the copper foil lands on the side on which no chip component is to be soldered is high, in addition to the advantages of the aspect of the invention described as the embodiment (1).

What is claimed is:

1. A through-hole wiring board comprising through-holes passing through a substrate and filled with an electroconductive material; copper foil lands and copper foil circuits formed on surfaces of the substrate; insulating layers formed on the copper foil circuits and portions between the copper foil lands and the copper foil circuits requiring insulation; and printed circuits formed by another electroconductive material having a different composition from that filling the through-holes on a part of the copper foil circuits, the copper foil lands, and ends of the through-holes and the insulating layers; wherein the printed circuits and ends of the through-holes are electrically connected with an electroconductive material having a different composition from that filling the through-holes.

2. A through-hole wiring board according to claim 1, wherein the electroconductive material filling the through-holes is a voidless or substantially voidless electroconductive material.

3. A through-hole wiring board according to claim 1, wherein the electroconductive material filling the through-holes or the electroconductive material for forming the printed circuits is an electroconductive paste.

4. A through-hole wiring board according to claim 3, wherein said electroconductive material for forming the printed circuits is said electroconductive paste.

5. A through-hole wiring board according to claim 1, wherein the copper foil lands and copper foil circuits are provided on a same surface of said substrate.

6. A through-hole wiring board according to claim 1, wherein said substrate has opposed main surfaces, and wherein the copper foil lands are provided on both of said opposed main surfaces, and said copper foil circuits are provided on both of said opposed main surfaces.

7. A through-hole wiring board according to claim 1, wherein said printed circuits are provided directly on said ends of the through-holes.

8. A through-hole wiring board according to claim 1, wherein said insulating layers are insulating layers formed by printing an insulating material on the copper foil circuits and portions between the copper foil lands and the copper foil circuits requiring insulation.

9. A through-hole wiring board according to claim 1, wherein the electroconductive material filling the through-holes is a through-hole electroconductive paste which comprises a binder and electroconductive powder, and main constituents of the binder are an alkoxy group-containing resol-type phenolic resin, a liquid epoxy resin and a curing agent for these resins; wherein the copper foil lands include first lands to which chip components are to be attached with solder and second lands to which no chip component is to be attached with solder; wherein the first lands are connected to ends of the through-hole electroconductive paste filling the through-holes by conducting printing on the first lands by use of a first land electroconductive paste which comprises a binder and electroconductive powder, the proportions of the binder and the electroconductive powder as solids in the first land electroconductive paste being in the volume ratio of the binder to the electroconductive powder of 21:79 to 55:45 and in the weight ratio of the binder to the electroconductive powder of 3.5:96.5 to 12:88, and the glass transition point of a cured product of the first land electroconductive paste being 40° to 180° C.; and wherein the second lands to which no chip component is to be attached with solder are connected to ends of the through-hole electroconductive paste filling the through-holes by conducting printing on the second foil lands by use of a second land electroconductive paste prepared from composite electroconductive powder of silver and copper and silver powder.

10. A through-hole wiring board according to claim 1 or 2, wherein the electroconductive material filling the through-holes comprises substantially spherical electroconductive powder, and the printed circuits formed on the insulating layers are an electroconductive material comprising composite electroconductive powder of silver and copper and silver powder.

11. A through-hole wiring board according to claim 10, wherein the electroconductive material filling the through-holes or the electroconductive material for forming the printed circuits is an electroconductive paste.

12. A through-hole wiring board according to claim 3, wherein the electroconductive paste comprises a binder and electroconductive powder, and main constituents of the binder are an alkoxy group-containing resol-type phenolic resin, a liquid epoxy resin and a curing agent for these resins.

13. A through-hole wiring board according to claim 12, wherein the alkoxy group-containing resol-type phenolic resin is a resol-type phenolic resin substituted by one or more alkoxy groups of 1 to 6 carbon atoms.

14. A through-hole wiring board according to claim 12, wherein the alkoxy group-containing resol-type phenolic resin is one which has an alkoxylation ratio of 5 to 95%.

15. A through-hole wiring board according to claim 12, wherein the alkoxy group-containing resol-type phenolic resin has a weight average molecular weight of 500 to 200,000.

16. A through-hole wiring board according to claim 12, wherein the electroconductive powder is one of or a mixture of two or more of silver, copper and silver-coated copper powder.

17. A through-hole wiring board according to claim 12, wherein the electroconductive powder is disagglomerated spherical or substantially spherical electroconductive powder.

18. A through-hole wiring board according to claim 12, wherein the proportions of the binder and the electroconductive powder as solids in the electroconductive paste are in the weight ratio of the binder to the electroconductive powder of 3:97 to 17:83.

19. A through-hole wiring board according to claim 12, wherein the blending proportions of the alkoxy group-containing resol type phenolic resin and the liquid epoxy resin are in the weight ratio of the alkoxy group-containing resol type phenolic resin to the liquid epoxy resin of 10:90 to 90:10.

20. A through-hole wiring board according to claim 3, wherein the electroconductive paste comprises a binder and electroconductive powder and has a specific gravity of 3 to 7.5.

21. A through-hole wiring board according to claim 20, wherein the proportions of the binder and the electroconductive powder as solids in the electroconductive paste are in the volume ratio of the binder to the electroconductive powder of 35:65 to 65:35.

22. A through-hole wiring board according to claim 20 or 21, wherein main constituents of the binder are an alkoxy group-containing resol-type phenolic resin, a liquid epoxy resin and a curing agent for these resins.

23. A through-hole wiring board according to claim 22, wherein the alkoxy group-containing resol-type phenolic resin is a resol-type phenolic resin substituted by one or more alkoxy groups of 1 to 6 carbon atoms.

24. A through-hole wiring board according to claim 23, wherein the alkoxy group-containing resol-type phenolic resin is one which has an alkoxylation ratio of 5 to 95%.

25. A through-hole wiring board according to claim 24, wherein the alkoxy group-containing resol-type phenolic resin has a weight average molecular weight of 500 to 200,000.

26. A through-hole wiring board according to claim 25, wherein the electroconductive powder is one of or a mixture of two or more of silver, copper and silver-coated copper powder.

27. A through-hole wiring board according to claim 26, wherein the electroconductive powder is disagglomerated spherical or substantially spherical electroconductive powder.

28. A through-hole wiring board according to claim 27, wherein the proportions of the binder and the electroconductive powder as solids in the electroconductive paste are in the weight ratio of the binder to the electroconductive powder of 3:97 to 17:83.

29. A through-hole wiring board according to claim 28, wherein the blending proportions of the alkoxy group-containing resol type phenolic resin and the liquid epoxy resin are in the weight ratio of the alkoxy group-containing resol type phenolic resin to the liquid epoxy resin of 10:90 to 90:10.

30. A through-hole wiring board according to claim 3, wherein the electroconductive paste comprises a binder and electroconductive powder; the proportions of the binder and the electroconductive powder as solids in the electroconductive paste are in the volume ratio of the binder to the electroconductive powder of 21:79 to 55:45 and in the weight ratio of the binder to the electroconductive powder of 3.5:96.5 to 12:88; and the glass transition point of a cured product of the electroconductive paste is 40° to 180° C.

31. A through-hole wiring board according to claim 30, wherein the binder is composed mainly of an epoxy resin composition and a curing agent for the composition, and the epoxy equivalent of the epoxy resin is 160 to 330 g/eq.

32. A through-hole wiring board according to claim 31, wherein the epoxy resin composition comprises an epoxy resin which is liquid at ordinary temperatures and a flexibilizer, and the blending proportions of the epoxy resin and the flexibilizer are in the weight ratio of the epoxy resin to the flexibilizer of 40:60 to 90:10.

33. A through-hole wiring board according to any one of claims 30 to 32, wherein the electroconductive powder is copper powder or copper alloy powder, which has a specific surface area of 0.1 to 1.0 m$^2$/g, an aspect ratio of 1 to 1.5 and an average particle size of 1 to 20 μm, and the electroconductive powder is substantially spherical electroconductive powder in which the exposed area of the copper powder or the copper alloy powder is 10 to 60%.

34. A through-hole wiring board according to claim 33, wherein the electroconductive powder is copper powder or copper alloy powder, the surface of which is substantially coated with silver with a portion thereof exposed, and the shape of the electroconductive powder is substantially spherical.

35. A through-hole wiring board according to any one of claims 30 to 32, wherein the electroconductive powder is copper powder or copper alloy powder, the surface of which is substantially coated with silver with a portion thereof exposed, and the shape of the electroconductive powder is substantially spherical.

36. A through-hole wiring board according to claim 3, wherein the electroconductive paste comprises electroconductive powder, a binder and a solvent; the electroconductive powder is copper powder or copper alloy powder, the surface of which is substantially coated with silver with a portion thereof exposed; and the electroconductive powder has a flake-like or flaky shape, an aspect ratio of 3 to 20 and an average particle size of 5 to 30 μm.

37. A through-hole wiring board according to claim 36, wherein the exposed area of the copper powder or copper alloy powder is 10 to 60%.

38. A through-hole wiring board according to claim 36 or 37, wherein the solvent is contained in an amount of 2 to 20 wt % based on the weight of the electroconductive paste.

39. A through-hole wiring board according to claim 38, wherein the boiling point of the solvent is 150° to 260° C.

40. A through-hole wiring board according to claim 36, wherein the boiling point of the solvent is 150° to 260° C.

41. A through-hole wiring board according to claim 3, wherein the electroconductive paste comprises a binder and electroconductive powder, and the electroconductive powder has a substantially spherical shape, a tap density of 4.5 to 6.2 g/cm$^3$ and a relative density of 50 to 68%.

42. A through-hole wiring board according to claim 41, wherein the electroconductive powder is copper powder or copper alloy powder, the surface of which is substantially coated with silver with a portion thereof exposed; and the shape of the electroconductive powder is substantially spherical.

43. A through-hole wiring board according to claim 41 or 42, wherein the electroconductive powder is copper powder or copper alloy powder, which has an aspect ratio of 1 to 1.5 and an average particle size of 1 to 20 μm, and the electroconductive powder is substantially spherical electroconductive powder in which the exposed area of the copper powder or the copper alloy powder is 10 to 60%.

44. A through-hole wiring board according to claim 36 or 41, wherein the proportions of the binder and the electroconductive powder as solids in the electroconductive paste are in the weight ratio of the binder to the electroconductive powder of 3.5:96.5 to 12:88.

* * * * *